United States Patent
Takeuchi et al.

(10) Patent No.: US 12,057,498 B2
(45) Date of Patent: *Aug. 6, 2024

(54) SILICON CARBIDE SEMICONDUCTOR DEVICE AND METHOD FOR MANUFACTURING SAME

(71) Applicant: DENSO CORPORATION, Kariya (JP)

(72) Inventors: Yuichi Takeuchi, Kariya (JP); Katsumi Suzuki, Toyota (JP); Yusuke Yamashita, Nagakute (JP); Takehiro Kato, Toyota (JP)

(73) Assignee: DENSO CORPORATION, Kariya (JP)

( * ) Notice: Subject to any disclaimer, the term of this patent is extended or adjusted under 35 U.S.C. 154(b) by 388 days.

This patent is subject to a terminal disclaimer.

(21) Appl. No.: 17/410,044

(22) Filed: Aug. 24, 2021

(65) Prior Publication Data

US 2021/0384343 A1    Dec. 9, 2021

Related U.S. Application Data

(63) Continuation of application No. PCT/JP2020/005592, filed on Feb. 13, 2020.

(30) Foreign Application Priority Data

Feb. 27, 2019  (JP) .................... 2019-034380
Jan. 22, 2020  (JP) .................... 2020-008376

(51) Int. Cl.
  *H01L 29/78*    (2006.01)
  *H01L 21/02*    (2006.01)
  (Continued)

(52) U.S. Cl.
  CPC ...... *H01L 29/781* (2013.01); *H01L 21/02057* (2013.01); *H01L 21/02529* (2013.01); (Continued)

(58) Field of Classification Search
  CPC ............ H01L 29/781; H01L 21/02057; H01L 21/02529; H01L 21/02576; H01L 21/046; (Continued)

(56) References Cited

U.S. PATENT DOCUMENTS 11,201,216 B2 *   12/2021  Kaji ................. H01L 29/1095
2015/0108564 A1 *  4/2015  Miura ............... H01L 29/1095
                                                      257/329

(Continued)

FOREIGN PATENT DOCUMENTS

JP       2003-045926 A    2/2003
JP       2010-177269 A    8/2010

*Primary Examiner* — J. E. Schoenholtz
(74) *Attorney, Agent, or Firm* — Posz Law Group, PLC

(57) ABSTRACT

A semiconductor device includes a semiconductor element having a substrate, a drift layer, a base region, a source region, trench gate structures, an interlayer insulating film, a source electrode, and a drain electrode. The substrate is made of silicon carbide. The drift layer is disposed on the substrate and has an impurity concentration lower than the substrate. The base region is made of silicon carbide and disposed on the drift layer. The source region is made of silicon carbide having an impurity concentration higher than the drift layer. Each trench gate structure has a gate trench, a gate insulating film, and a gate electrode. The interlayer insulating film covers the gate electrode and the gate insulating film. The source electrode is in ohmic-contact with the source region. The drain electrode is disposed on a rear surface of the substrate.

15 Claims, 16 Drawing Sheets

(51) Int. Cl.
   *H01L 21/04* (2006.01)
   *H01L 21/66* (2006.01)
   *H01L 29/08* (2006.01)
   *H01L 29/10* (2006.01)
   *H01L 29/16* (2006.01)
   *H01L 29/423* (2006.01)
   *H01L 29/66* (2006.01)

(52) U.S. Cl.
   CPC ...... *H01L 21/02576* (2013.01); *H01L 21/046* (2013.01); *H01L 22/14* (2013.01); *H01L 29/086* (2013.01); *H01L 29/1095* (2013.01); *H01L 29/1608* (2013.01); *H01L 29/4236* (2013.01); *H01L 29/66068* (2013.01); *H01L 29/7813* (2013.01)

(58) Field of Classification Search
   CPC ... H01L 22/14; H01L 29/086; H01L 29/1095; H01L 29/1608; H01L 29/4236; H01L 29/66068; H01L 29/7813; H01L 29/0882; H01L 29/0634; H01L 29/7397
   See application file for complete search history.

(56) References Cited

U.S. PATENT DOCUMENTS

| | | |
|---|---|---|
| 2015/0333175 A1 | 11/2015 | Kiyosawa et al. |
| 2016/0104794 A1 | 4/2016 | Takeuchi et al. |
| 2017/0229535 A1 | 8/2017 | Hatta et al. |
| 2018/0145137 A1* | 5/2018 | Yamamoto .......... H01L 21/0465 |
| 2019/0214264 A1* | 7/2019 | Takagi ................ H01L 29/1608 |
| 2020/0058787 A1* | 2/2020 | Nguyen .............. H01L 29/7817 |
| 2020/0083369 A1* | 3/2020 | Kobayashi .......... H01L 29/0623 |
| 2020/0161467 A1 | 5/2020 | Takeuchi et al. |
| 2020/0203482 A1 | 6/2020 | Kaji et al. |
| 2022/0157945 A1* | 5/2022 | Tamura ................ H01L 29/045 |

\* cited by examiner

US 12,057,498 B2

SILICON CARBIDE SEMICONDUCTOR DEVICE AND METHOD FOR MANUFACTURING SAME

CROSS REFERENCE TO RELATED APPLICATIONS

The present application is a continuation application of International Patent Application No. PCT/JP2020/005592 filed on Feb. 13, 2020, which designated the U.S. and claims the benefit of priority from Japanese Patent Application No. 2019-034380 filed on Feb. 27, 2019 and Japanese Patent Application No. 2020-008376 filed on Jan. 22, 2020. The entire disclosures of all of the above applications are incorporated herein by reference.

TECHNICAL FIELD

The present disclosure relates to relates to a silicon carbide semiconductor device having a semiconductor element with a metal oxide semiconductor (MOS) structure made of silicon carbide (hereinafter may also be referred to as SiC) and a method for manufacturing the SiC semiconductor device.

BACKGROUND

A SiC semiconductor device may have a trench gate structure as a structure in which a channel density is increased to allow a large current to flow.

SUMMARY

The present disclosure describes a silicon carbide semiconductor device including an inverted semiconductor element. The inverted semiconductor element has a substrate, a drift layer, a base region, a source region, trench gate structures, an interlayer insulating film, a source electrode and a drain electrode.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
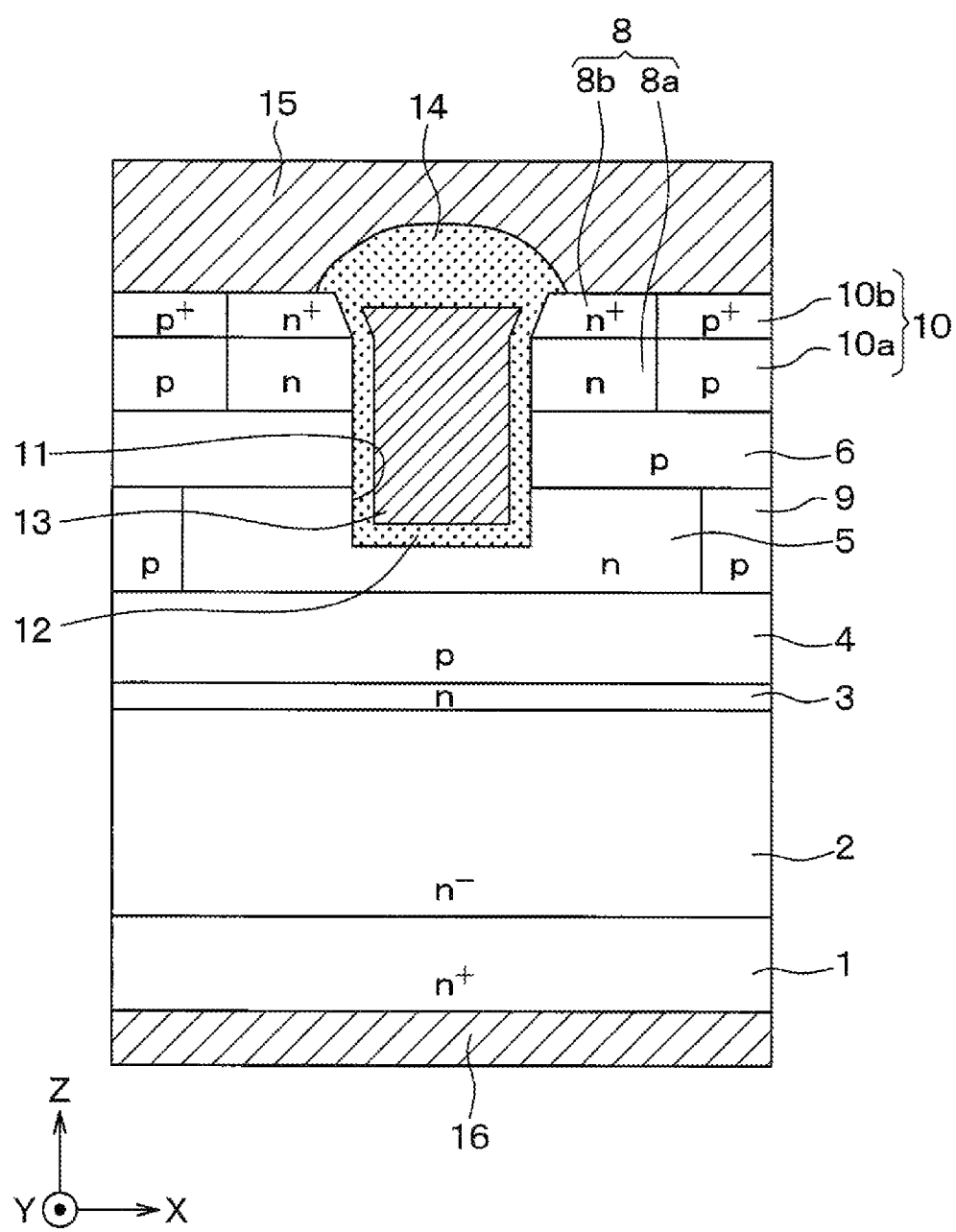
FIG. 1 is a cross-sectional view of a SiC semiconductor device according to a first embodiment.

A SiC semiconductor device has a structure in which a p-type base region and an $n^+$-type source region are formed in order over an n-type drift layer, and a trench gate is provided so as to penetrate through the p-type base region from a surface of the $n^+$-type source region and reach the $n^+$-type drift layer. The p-type base region is epitaxially grown on the n-type drift layer, and then an n-type impurity is implanted into the p-type base region by ion implantation to invert a part of the p-type base region into an n-type, thereby forming the $n^+$-type source region.

Since the entire $n^+$-type source region is formed of a high-concentration n-type impurity layer, a saturation current value at the time of load short-circuiting becomes large, and a short-circuit withstand capability of the SiC semiconductor device cannot be obtained.

The film thickness variation at the time of epitaxial growth becomes larger as the film thickness to be grown becomes thicker, but the variation in the range of ion implantation is not so large, so that the film thickness variation of the p-type base region after ion implantation becomes a variation corresponding to the film thickness of the epitaxially grown film. For this reason, in a situation where the $n^+$-type source region is formed by ion implantation to the p-type base region, the variation in the thickness of the $n^+$-type source region becomes smaller and the variation in the thickness of the p-type base region becomes larger. The variation in the threshold value Vt may occur.

In a situation where the $n^+$-type source region is formed by ion implantation, the side surface of the trench gate is tilted when the trench gate is formed due to the influence of the damage through the ion implantation. Therefore, the channel mobility is lowered, and the trench gate becomes wider at the entrance side of the trench. Therefore, it is difficult to miniaturize the element.

The inventors in the present application had studied a situation in which not only the p-type base region is formed through the epitaxial growth but also the $n^+$-type source region is formed through the epitaxial growth. Since the variation in thickness is distributed to each of the p-type base region and the $n^+$-type source region, it is possible to reduce the variation in the thickness of the p-type base region. However, in order to epitaxially grow the $n^+$-type source region, it is required to introduce n-type dopant gas into an epitaxial growth apparatus with a higher concentration, and the n-type dopant remains in the epitaxial growth apparatus and contaminate a growth furnace after the formation of the $n^+$-type source region. As a result, the control of the impurity concentration may become unstable after the dopant contamination occurs during the formation of the p-type layer or the n-type layer.

The first aspect of the present disclosure relates to a silicon carbide semiconductor device. The silicon carbide semiconductor device includes a semiconductor element. The semiconductor element includes a substrate, a drift layer, a base region, a source region, trench gate structures, an interlayer insulating film, a source electrode, and a drain electrode. The substrate is made of silicon carbide having a first conductivity type or a second conductivity type. The drift layer is disposed on the substrate and made of silicon carbide having the first conductivity type with an impurity concentration lower than the substrate. The base region is made of silicon carbide having the second conductivity type and disposed on the drift layer. The source region is made of silicon carbide having the first conductivity type with a first conductivity type impurity concentration higher than the drift layer and disposed on the base region. Each of the trench gate structures has a gate trench, a gate insulating film and a gate electrode. The gate trench is disposed deeper than the base region from a surface of the source region. The gate insulating film covers an inner wall of the gate trench. The gate electrode is disposed on the gate insulating film. The trench gate structures are aligned in a stripe-shaped pattern along a direction corresponding to a longitudinal direction of the trench gate structures. The interlayer insulating film covers the gate electrode and the gate insulating film, and includes a contact hole. The source electrode is in ohmic-contact with the source region through the contact hole. The drain electrode is disposed on a rear surface of the substrate. The source region includes: a first source region that has an epitaxial growth layer disposed at the base region; and a second source region that is in contact with the source electrode, and that has an ion implanted layer having the first conductivity type with the first conductivity type impurity concentration higher than the source region.

As described above, the source region with a relatively low concentration is configured as the first source region, and the source region with a concentration higher than the first source region is configured as the second source region. The first source region is formed by the epitaxial growth layer, and the second source region is formed by the ion implantation layer. For this reason, it is possible to form the SiC semiconductor device having a structure with enhancement in the short-circuit tolerance or suppression of the tilt of the side surface of the drain gate, and with easier control of the impurity concentration.

The second aspect of the present disclosure relates to a method for manufacturing a silicon carbide semiconductor device. The method includes: preparing a substrate made of silicon carbide having a first conductivity type or a second conductivity type; forming a drift layer disposed on the substrate and made of silicon carbide having the first conductivity type with an impurity concentration lower than the substrate; forming a base region made of silicon carbide having the second conductivity type on the drift layer; forming a source region made of silicon carbide having the first conductivity type with a first conductivity type impurity concentration higher than the drift layer on the base region; forming trench gate structures by forming gate trenches, which are deeper than the base region from a surface of the source region and are aligned in a stripe shape along a longitudinal direction of the gate trenches; forming a gate insulating film at an inner surface of each of the gate trenches; and forming a gate electrode on the gate insulating film; forming a source electrode electrically connected to the base region; and forming a drain electrode at a rear surface of the substrate. The source region has a first source region and a second source region. The first source region is formed at the base region, and the second source region is formed on the first source region and having an impurity concentration higher than the first source region. In the forming of the base region, the base region is formed by epitaxial growth. In the forming of the source region, the first source region is formed by the epitaxial growth and then the second source region is formed by ion implantation of first conductivity type impurities to the first source region.

The first source region is formed by the epitaxial growth layer, and the second source region is formed by the ion implantation layer. For this reason, it is possible to form the SiC semiconductor device having a structure with enhancement in the short-circuit tolerance or suppression of the tilt of the side surface of the drain gate, and with easier control of the impurity concentration.

The third aspect of the present disclosure relates to a method for manufacturing a silicon carbide semiconductor device. The method includes: growing epitaxially an n-type silicon carbide layer as a measurement target layer; stabilizing a surface electron of the n-type silicon carbide layer subsequent to growing epitaxially the n-type silicon carbide layer; and measuring n-type impurity concentration of the n-type silicon carbide layer by measuring a surface potential of the n-type silicon carbide layer after coating an electric charge to charge a surface of the n-type silicon carbide layer subsequent to stabilizing the surface electron of the n-type silicon carbide layer.

As described above, the measurement of the surface potential of the SiC layer is performed after stabilizing the surface electrons of the SiC layer. As a result, it is possible to measure the n-type impurity concentration of the SiC layer with enhanced accuracy.

Embodiments of the present disclosure will be hereinafter described with reference to the drawings. In the following embodiments, the same or equivalent parts are denoted by the same reference numerals for description.

First Embodiment

Figure 2:
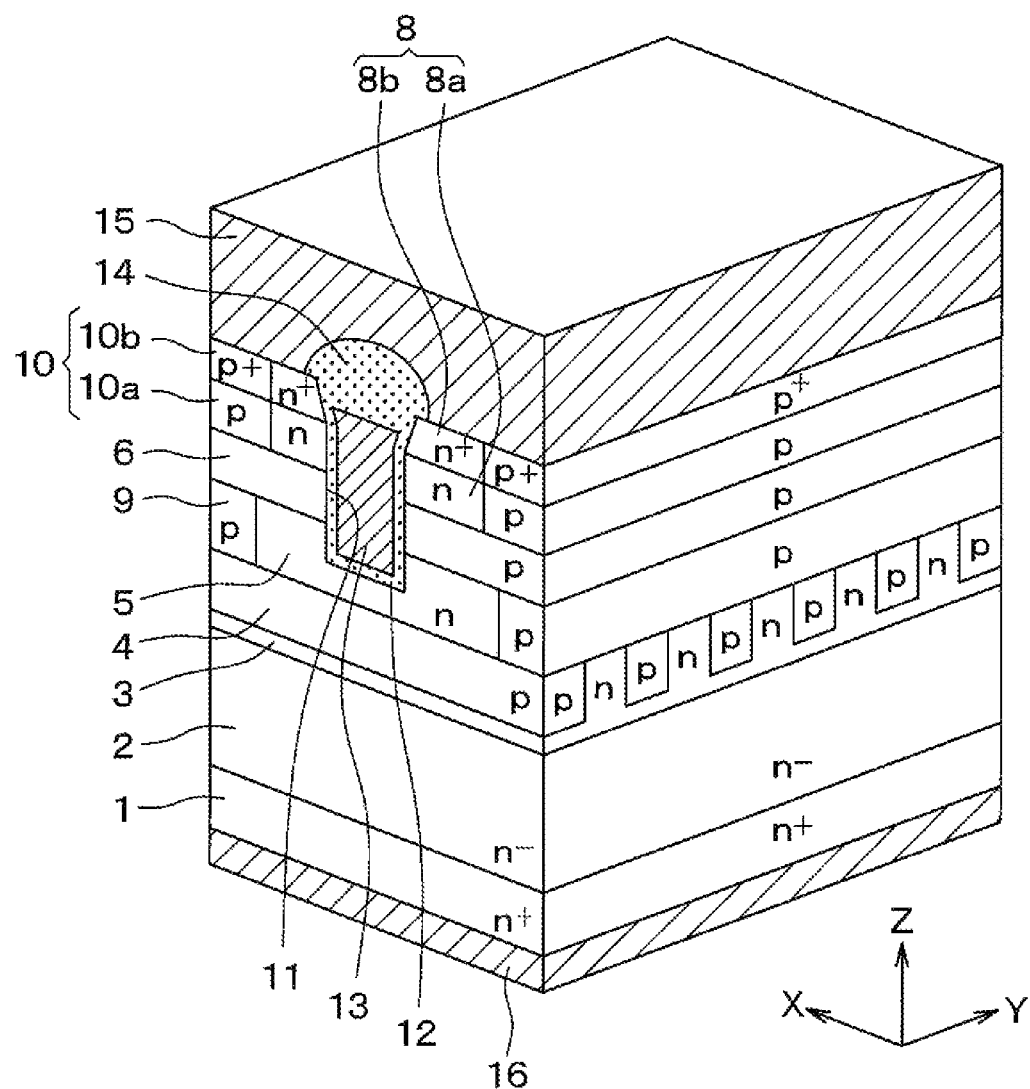
FIG. 2 is a perspective cross-sectional view of the SiC semiconductor device shown in FIG. 1.

A first embodiment will be described. In a SiC semiconductor device according to the present embodiment, an inverted vertical metal-oxide semiconductor field-effect transistor (MOSFET) having a trench gate structure shown in FIGS. 1 and 2 is formed as a semiconductor device. The vertical MOSFET shown in those figures is formed in a cell region of the SiC semiconductor device, and the SiC semiconductor device is configured by forming an outer peripheral withstand voltage structures so as to surround the cell region, but only the vertical MOSFET is shown in the figures. In the following description, as shown in FIGS. 1 and 2, a width direction of the vertical MOSFET is taken as an X-direction, a depth direction of the vertical MOSFET crossing the X-direction is taken as a Y-direction, a thickness direction or depth direction of the vertical MOSFET, that is, a normal direction to an XY-plane is taken as a Z-direction.

As shown in FIGS. 1 and 2, an $n^+$-type substrate 1 made of SiC is used as a semiconductor substrate in a SiC semiconductor device. An $n^-$-type layer 2 made of SiC is formed on a main surface of the $n^+$-type substrate 1. The surface of the $n^+$-type substrate 1 is a (0001) Si surface, an n-type impurity concentration of the substrate 1 is, for example, $5.9 \times 10^{18}/cm^3$, and a thickness of the substrate 1 is 100 μm. The $n^-$-type layer 2 has an n-type impurity concentration of, for example, $7.0 \times 10^{15}$ to $2.0 \times 10^{16}/cm^3$ and a thickness of 8.0 μm.

A JFET portion 3 made of SiC and an electric field blocking layer 4 are formed over the $n^-$ type layer 2, and the $n^-$-type layer 2 is connected to the JFET portion 3 at a position away from the $n^+$-type substrate 1.

The junction field effect transistor (JFET) portion 3 and the electric field blocking layer 4 configure a saturation current limiting layer, and are both extended in the X-direction and alternately and repeatedly aligned in the Y-direction. In other words, at least a part of the JFET portion 3 and the electric field blocking layer 4 are shaped in multiple rectangles, that is, stripes, as viewed from a normal direction to the main surface of the $n^+$-type substrate 1, and are alternately arranged.

In the present embodiment, the JFET portion 3 is formed below the electric field blocking layer 4. For that reason, the stripe-shaped portions of the JFET portion 3 are connected to each other below the electric field blocking layer 4, but each of the stripe-shaped portions is arranged between the multiple pieces of the electric field blocking layer 4.

The stripe-shaped portions of the JFET portion 3, that is, the rectangular portions each have a width of, for example, 0.25 μm and a pitch as a formation interval of, for example, 0.6 to 2.0 μm. A thickness of the JFET portion 3 is set to, for example, 1.5 μm, and an n-type impurity concentration of the JFET portion 3 is set to be higher than that of the $n^-$-type layer 2, and is set to, for example, $5.0 \times 10^{16}$ to $2.0 \times 10^{18}/cm^3$.

The electric field blocking layer 4 is formed of a p-type impurity layer. As described above, the electric field blocking layer 4 has a stripe shape, and each strip-shaped portion of the electric field blocking layer 4 having a stripe shape has a width of, for example, 0.15 μm and a thickness of, for example, 1.4 μm. The electric field blocking layers 4 has a p-type impurity concentration of, for example, $3.0 \times 10^{17}$ to $1.0 \times 10^{18}/cm^3$. In the present embodiment, the electric field blocking layer 4 has a constant p-type impurity concentration in the depth direction. A surface of the electric field blocking layer 4 at a side opposite to the $n^-$-type layer 2 is flush with a surface of the JFET portion 3.

Further, an n-type current dispersion layer 5 made of SiC is formed on the JFET portion 3 and the electric field blocking layer 4. The n-type current dispersion layer 5 is a layer that allows a current flowing through a channel to spread in the X-direction, as will be described later, and has, for example, a higher n-type impurity concentration than the $n^-$-type layer 2. In the present embodiment, the n-type current dispersion layer 5 extends in the Y-direction, and has the n-type impurity concentration which is the same as or higher than that of the JFET portion 3, and a thickness of, for example, 0.5 μm.

In this example, the drift layer is described as being divided into the $n^-$-type layer 2, the JFET portion 3, and the n-type current dispersion layer 5 for the sake of convenience, but those components are portions which configure the drift layer and are connected to each other.

A p-type base region 6 made of SiC is formed on the n-type current dispersion layer 5. Furthermore, an n-type source region 8 is formed on the p-type base region 6. The n-type source region 8 is formed on a portion of the p-type base region 6 corresponding to the n-type current dispersion layer 5.

The p-type base region 6 has a thickness smaller than that of the electric field blocking layer 4 and a p-type impurity concentration lower than that of the electric field blocking layer 4, and has a p-type impurity concentration of, for example, $3 \times 10^{17}/cm^3$ and a thickness of 0.4 to 0.6 μm.

The n-type source region 8 has a structure in which the n-type impurity concentration differs between one side of the non-doped layer 7 and the p-type base region 6 and the other side opposite to one side, that is, an element front surface side. More specifically, the n-type source region 8 has a first source region 8a disposed on the side of the p-type base region 6, and a second source region 8b disposed on the element front surface side.

The first source region 8a has an n-type impurity concentration lower than that of the second source region 8b, and is in contact with the p-type base region 6 in the present embodiment. The first source region 8a is configured by an epitaxial growth layer. The first source region 8a has an n-type impurity concentration of, for example, $2.0 \times 10^{16}$ to $1.0 \times 10^{17}/cm^3$ or less, and a thickness of 0.2 to 0.5 μm, preferably 0.3 μm or more.

The second source region 8b is a region for bringing in contact with the source electrode 15, which will be described later, and is configured by an ion implanted layer. The second source region 8b has a high n-type impurity concentration. The second source region 8b has an n-type impurity concentration of, for example, $1.0 \times 10^{18}$ to $5.0 \times 10^{19}/cm^3$ and a thickness of 0.1 to 0.2 μm.

In addition, a p-type deep layer 9 is formed downward from the p-type base region 6, specifically, between the surfaces of the JFET portion 3 and the electric field blocking layer 4 and the p-type base region 6, in a portion where the n-type current dispersion layer 5 is not formed. In the present embodiment, the p-type deep layer 9 is formed in a strip shape in a direction intersecting with the stripe-shaped portions of the JFET portion 3 and a longitudinal direction of the electric field blocking layer 4, in this example, with the Y-direction as a longitudinal direction, and is laid out in a stripe shape by aligning the multiple p-type deep layers 9 in the X-direction. The p-type base region 6 and the electric field blocking layer 4 are electrically connected to each other through the p-type deep layer 9. A formation pitch of the p-type deep layer 9 is matched with a cell pitch serving as a formation interval of trench gate structures to be described later, and the p-type deep layer 9 is disposed between the adjacent trench gate structures.

Further, a p-type coupling layer 10 is formed on the p-type base region 6 at a position corresponding to the p-type deep layer 9, that is, at a position different from that of the n-type source region 8 and on the opposite side of the trench gate structure across the n-type source region 8. The p-type coupling layer 10 is a layer for electrically connecting the p-type base region 6 to the source electrode 15 to be described later. In the present embodiment, the p-type coupling layer 10 has a structure in which the p-type impurity concentration is different between the p-type base region 6 side and the opposite side to the opposite side, that is, the element front surface side. Specifically, the p-type coupling layer 10 is configured to have a first region 10a disposed on the p-type base region 6 side and a second region 10b disposed on the element front surface side.

The first region 10a is configured to be substantially the same as or deeper than the first source region 8a, has a lower p-type impurity concentration than that of the second region 10b, and is in contact with the p-type base region 6. The first region 10a has a p-type impurity concentration of, for example, $2.0 \times 10^{17}$ to $1.0 \times 10^{19}/cm^3$ and a thickness of 0.2 to 0.5 μm, preferably 0.3 μm or more. However, in the present embodiment, since the first region 10a is formed by ion implantation into the first source region 8a, the carrier concentration, that is, the p-type impurity concentration for functioning as a carrier is set to $2.0 \times 10^{17}$ to $1.0 \times 10^{19}/cm^3$.

The second region 10b has the same depth as that of the second source region 8b, and is a region for bringing in contact with the source electrode 15, which will be described later, and has a high p-type impurity concentration. The second region 10b has, for example, a p-type impurity concentration of $2.0 \times 10^{18}$ to $1.0 \times 10^{20}/cm^3$ and a thickness of 0.2 to 0.3 μm. However, in the present embodiment, since the second region 10b is formed by ion implantation into the second source region 8b, the carrier concentration, that is, the p-type impurity concentration for functioning as a carrier is set to $2.0 \times 10^{18}$ to $1.0 \times 10^{20}/cm^3$.

As will be described later, in the present embodiment, the p-type coupling layer 10 is formed by ion implantation of the p-type impurity into the n-type source region 8. In this case, the p-type impurity concentration of the first region 10a and the second region 10b means the concentration of the p-type impurity which functions as a carrier. A portion of the p-type impurity is canceled with the n-type impurity contained in the first source region 8a prior to implantation, and does not function as a carrier. For that reason, when the p-type coupling layer 10 is formed by ion implantation, the p-type impurity concentration described above can be obtained by implanting the p-type impurity at a dose amount of, for example, 2 to 10 times the n-type impurity concentration in the first source region 8a or the second source region 8b in consideration of an activation rate.

Further, a gate trench 11 having a width of, for example, 0.4 μm and a depth of 0.2 to 0.4 μm deeper than the sum total film thickness of the p-type base region 6 and the n-type source region 8 is formed so as to penetrate through the n-type source region 8 and the p-type base region 6 and reach the n-type current dispersion layer 5. The above described p-type base region 6 and n-type source region 8 are arranged so as to be in contact with the side surface of the gate trench 11. The gate trench 11 is formed in a strip-shaped layout in which the X-direction in FIG. 2 is defined as a width direction, the direction intersecting with the longitudinal direction of the JFET portion 3 and the electric field blocking layer 4, in this case, the Y-direction is defined as a longitudinal direction, and the Z-direction is defined as a depth direction. Though not shown in FIGS. 1 and 2, multiple gate trenches 11 are formed in a stripe shape disposed at regular intervals in the X-direction, and the p-type base region 6 and the n-type source region 8 are disposed between the respective gate trenches 11. In addition, the p-type deep layer 9 and the p-type coupling layer 10 are disposed at intermediate positions of the gate trenches 11.

At the side surface of the gate trench 11, the p-type base region 6 forms a channel region that connects the n-type source region 8 and the n-type current dispersion layer 5 when the vertical MOSFET is operated. An inner wall surface of the gate trench 11 including the channel region is covered with a gate insulating film 12. A gate electrode 13 made of doped Poly-Si is formed on a surface of the gate insulating film 12, and the gate trench 11 is filled with the gate insulating film 12 and the gate electrode 13 to form a trench gate structure.

The trench gate structure has a structure in which the side wall of the gate trench 11 is substantially parallel to the Z-direction, and is rounded and tilted on the entrance side of the opening so that the opening width is slightly wider than the bottom part. The portion of the sidewall of the gate trench 11 in contact with the first source region 8a, the p-type base region 6 and the n-type current dispersion layer 5 is substantially parallel to the Z-direction, and the portion in contact with the second source region 8b is rounded and tilted.

The source electrode 15, a gate wire layer (not shown), and the like are formed on the surface of the n-type source region 8 and the surface of the gate electrode 13 across an interlayer insulating film 14. The source electrode 15 and the gate wire layer are made of multiple metals, for example, Ni/Al. At least a portion of the multiple metals which is in contact with the n-type SiC, specifically, the n-type source region 8 is made of a metal capable of bringing in ohmic contact with the n-type SiC. In addition, at least a portion of the multiple metals which is in contact with the p-type SiC, specifically, the second region 10b is made of a metal capable of bringing in ohmic contact with the p-type SiC. The source electrode 15 is electrically insulated from the SiC portion by being formed on the interlayer insulating film 14, but comes in electric contact with the n-type source region 8 and the p-type deep layer 9 through a contact hole provided in the interlayer insulating film 14.

On the other hand, a drain electrode 16 electrically connected to the n⁺-type substrate 1 is formed on a rear surface of the n⁺-type substrate 1. Such a structure configures a vertical MOSFET of an n-channel type inverted trench gate structure. A cell region is formed by placing the vertical MOSFET cells described above. The SiC semiconductor device is configured by providing an outer peripheral withstand voltage structure by a guard ring (not shown) or the like so as to surround a cell region in which such a vertical MOSFET is formed.

The SiC semiconductor device having the vertical MOSFET configured as described above is operated by applying a gate voltage Vg of 20 V to the gate electrode 13 while a source voltage Vs is set to 0 V and a drain voltage Vd is set to 1 to 1.5 V, for example. That is, the vertical MOSFET forms the channel region in the p-type base region 6 in contact with the gate trench 11 when the gate voltage Vg is applied. Thereby, the n-type source region 8 and the n-type current dispersion layer 5 are electrically conducted. Therefore, the vertical MOSFET performs the operation of allowing a current to flow between the drain and the source from the n⁺-type substrate 1 through the drift layer formed of the n⁻-type layer 2, the JFET portion 3, and the n-type current dispersion layer 5, and from the channel region through the n-type source region 8.

In addition, when the vertical MOSFET in the semiconductor device described above is applied to inverter circuits or the like in which an upper arm and a lower arm are provided, a parasitic diode incorporated in the vertical MOSFET functions as a freewheeling diode. Specifically, a parasitic diode is formed by a PN junction formed by an n-type layer forming a drift layer such as the n⁻-type layer 2 and a p-type layer including the electric field blocking layer 4, the p-type base region 6, or the p-type deep layer 9, and the parasitic diode functions as a freewheeling diode.

The inverter circuit or the like is used when supplying an AC current to a load such as an AC motor or the like while using a DC power supply. For example, in an inverter circuit or the like, multiple bridge circuits in which an upper arm and a lower arm are connected in series to a DC power supply are connected in parallel to each other, and the upper arm and the lower arm of each bridge circuit are alternately and repeatedly turned on and off, thereby supplying an AC current to a load.

Specifically, in the respective bridge circuits such as the inverter circuits, the vertical MOSFET of the upper arm is turned on and the vertical MOSFET of the lower arm is turned off, thereby supplying a current to the load. Thereafter, the vertical MOSFET of the upper arm is turned off, and the vertical MOSFET of the lower arm is turned on to stop supplying the current. When the vertical MOSFET of the respective arms is switched on and off, the parasitic diode provided in the vertical MOSFET to be turned off functions as a freewheeling diode and performs an operation during reverse conduction in which a reflux current flows between the source and the drain. In this manner, AC driving of the load by the inverter circuit or the like is performed.

In performing such an operation, when load short-circuit occurs, a voltage of, for example, 600 to 1200 V or more is applied to the drain as a drain-source voltage Vds. At this time, if the entire n-type source region 8 is formed of an n-type impurity layer having a high concentration, a saturation current value at the time of load short-circuiting becomes large, and the short-circuit withstand capability of the SiC semiconductor device cannot be obtained. This is considered to be because, since the n-type source region 8 has the high concentration, a depletion region is hardly generated, and a current flows in the entire n-type source region 8.

However, in the SiC semiconductor device according to the present embodiment, since the n-type source region 8 is configured by the first source region 8a having a relatively low concentration and the second source region 8b having a higher concentration, the saturation current value at the time of load short-circuiting can be reduced. This is considered to be because, since the first source region 8a has a low density, depletion occurs so as to enter a wide area of the first source region 8a, and a current does not flow in the depleted area. This makes it possible to improve the short-circuit withstand capability of the SiC semiconductor device.

Figure 3:
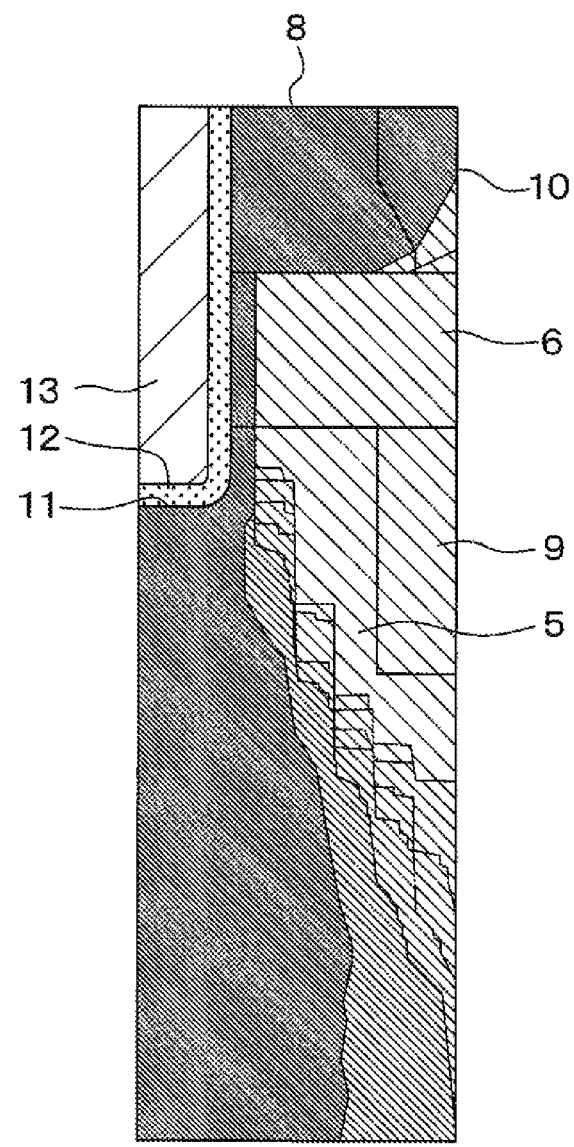
FIG. 3 is a graph showing a result of a simulation of an electron current density in the case where an entire n-type source region has a high concentration.
Figure 4:
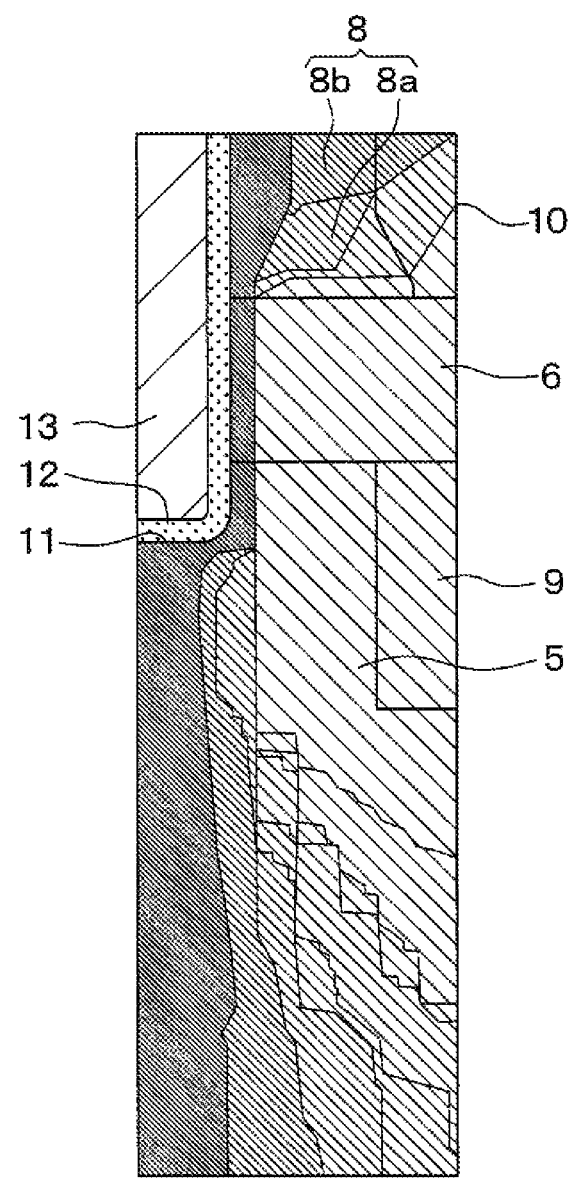
FIG. 4 is a graph showing a result of the simulation of the electron current density in the case where the n-type source region is configured by a first source region and a second source region.
Figure 5:
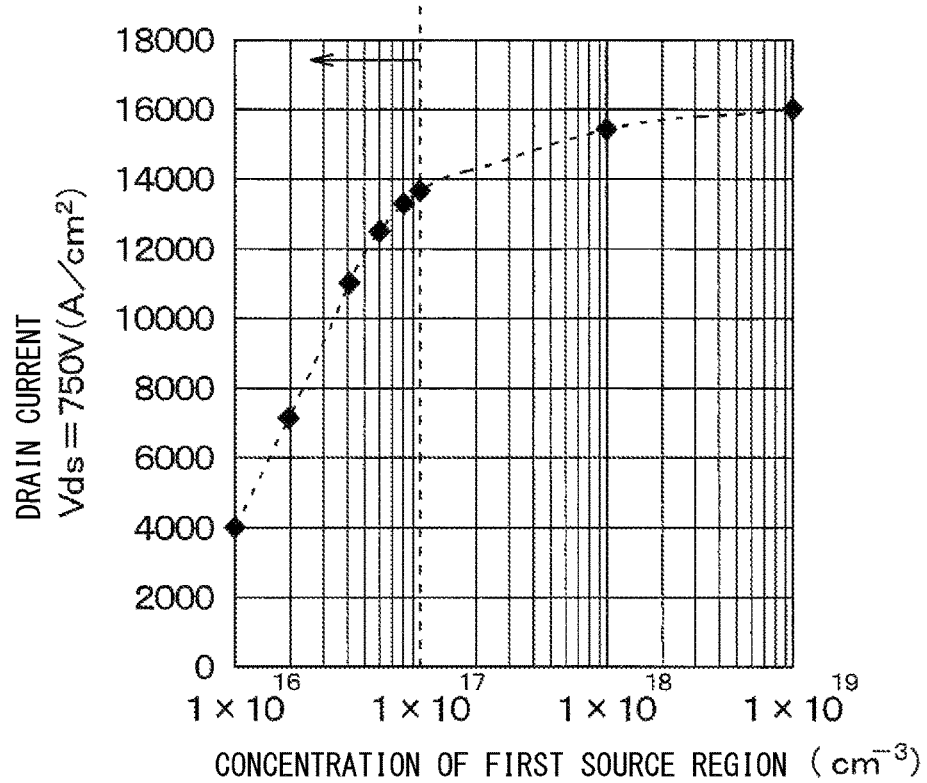
FIG. 5 is a graph showing a result of the simulation of a change of a drain current while changing an impurity concentration of the first source region.

In this example, in each of a case in which the entire n-type source region 8 is set to have a high concentration, and a case in which the entire n-type source region 8 is configured by the first source region 8a and the second source region 8b as in the present embodiment, an electron current density is examined by simulation. FIGS. 3 and 4 are diagrams showing the respective results. In the drawing, the electron current density is higher in a portion where an interval between hatching is narrower. In addition, a change in the drain current is examined by changing the impurity concentration of the first source region 8a. FIG. 5 shows the results.

In the simulations of FIGS. 3 to 5, it is assumed that the source voltage Vs is 0 V, the gate voltage Vg is 20 V, and the drain voltage Vd is 750 V. In the simulations shown in FIG. 3, the n-type impurity concentration in the entire n-type source region 8 is set to $1.0 \times 10^{19}/\text{cm}^3$. Similarly, in the simulations of FIG. 4, while the n-type source region 8 is configured by the first source region 8a and the second source region 8b, the n-type impurity concentration of the first source region 8a is set to $1.0 \times 10^{16}/\text{cm}^3$, and the n-type impurity concentration of the second source region 8b is set to $1.0 \times 10^{19}/\text{cm}^3$. In the simulations of FIG. 5, while the n-type source region 8 is configured of the first source region 8a and the second source region 8b, the n-type impurity concentration of the second source region 8b is set to $1.0 \times 10^{19}/\text{cm}^3$, and the n-type impurity concentration of the first source region 8a is changed.

As shown in FIG. 3, when the n-type impurity concentration in the entire n-type source region 8 is high, it is understood that the electron current density is high in the entire n-type source region 8. This is considered to be because, since the n-type source region 8 has the high concentration, a depletion region is hardly generated, and a current flows in the entire n-type source region 8.

On the other hand, as shown in FIG. 4, when the n-type source region 8 is formed of the first source region 8a and the second source region 8b, it is understood that the electron current density is reduced in the first source region 8a. This is considered to be because, since the first source region 8a has a low density, depletion occurs so as to enter a wide area of the first source region 8a, and a current does not flow in the depleted area.

From the simulation results, it is conceivable that the saturation current value at the time of load short-circuiting can be reduced by configuring the n-type source region 8 by the first source region 8a and the second source region 8b. Therefore, it is understood that the structure of the present embodiment makes it possible to improve the short-circuit withstand capability of the SiC semiconductor device.

Although the n-type impurity concentration of the first source region 8a may be lower than that of the second source region 8b, the saturation current value cannot be lowered to a desired value unless the concentration is at a certain level. Specifically, if the drain current at the time of load short-circuiting the load is set to be equal to or less than the 14000 A/cm², a desired short-circuit withstand capability can be obtained. As shown in FIG. 5, the drain current at the time of the load short-circuiting becomes equal to or less than 14000 A/cm² when the n-type impurity concentration of the first source region 8a becomes equal to or less than $1.0 \times 10^{17}/\text{cm}^3$. Therefore, as in the SiC semiconductor device of the present embodiment, the n-type impurity concentration of the first source region 8a is set to $1.0 \times 10^{17}/\text{cm}^3$ or less, thereby being capable of improving the short-circuit withstand capability.

Figure 6:
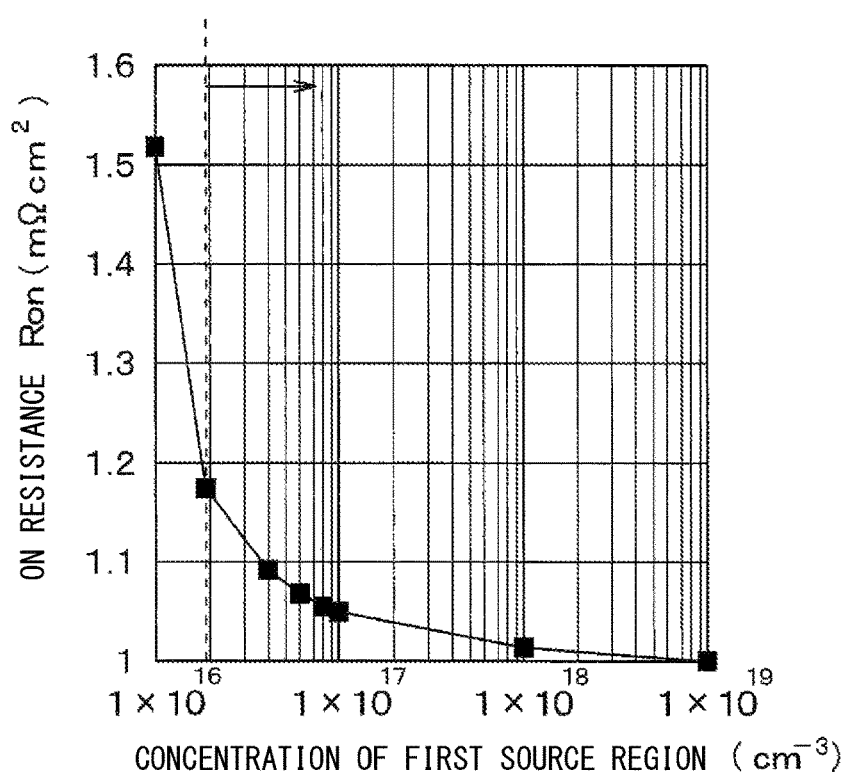
FIG. 6 is a graph showing a result of the simulation of a relationship between an n-type impurity concentration and an on-resistance of the first source region.

However, if the n-type impurity concentration of the first source region 8a is too low, a resistance value of the first source region 8a becomes too large, with the result that an on-resistance Ron increases. A relationship between the n-type impurity concentration and the on-resistance Ron of the first source region 8a is examined, and the result shown in FIG. 6 is obtained. In view of the high-speed switching operation of the SiC semiconductor device, the on-resistance Ron is preferably 1.2 mΩcm² or less. According to the result of FIG. 6, when the n-type impurity concentration of the first source region 8a is less than $2.0\times10^{16}$/cm³, the on-resistance Ron rapidly rises, but when the n-type impurity concentration is greater than or equal to 1.2 mΩcm² or less, the on-resistance Ron can be reduced to 1.2 mΩcm² or less. Therefore, as in the SiC semiconductor device of the present embodiment, the n-type impurity concentration of the first source region 8a is set to $2.0\times10^{16}$/cm³ or more, thereby being capable of inhibiting the on-resistance Ron from deteriorating.

In this manner, the n-type impurity concentration of the first source region 8a is set to $2.0\times10^{16}$ to $1.0\times10^{17}$/cm³, thereby being capable of inhibiting the on-resistance Ron from deteriorating while the short-circuit withstand capability is improved.

Further, the SiC semiconductor device of this embodiment includes the JFET portion 3 and the electric field blocking layer 4. For that reason, during the operation of the vertical MOSFET, the JFET portion 3 and the electric field blocking layer 4 function as a saturation current control layer, and exhibit the saturation current control effect, so that a low on-resistance can be achieved and a low saturation current can be maintained. Specifically, since the stripe shaped portions of the JFET portion 3 and the electric field blocking layer 4 are alternately formed repeatedly, the following operation is performed.

First, when the drain voltage Vd is a voltage applied during normal operation, for example, 1 to 1.5 V, the depletion layer extending from the electric field blocking layer 4 to the JFET portion 3 extends only to a width smaller than the width of the stripe shaped portion of the JFET portion 3. For that reason, even if the depletion layer extends into the JFET portion 3, a current path is secured. Since the n-type impurity concentration of the JFET portion 3 is higher than the concentration of the n⁻-type layer 2, and the current path can be configured to have a low resistance, a low on-resistance can be achieved.

When the drain voltage Vd becomes higher than the drain voltage Vd at the time of normal operation due to a load short-circuiting or the like, the depletion layer extending from the electric field blocking layer 4 to the JFET portion 3 extends more than the width of the stripe shaped portion of the JFET portion 3. Then, the JFET portion 3 is immediately pinched off prior to the n-type current dispersion layer 5. At this time, a relationship between the drain voltage Vd and the width of the depletion layer is determined based on the width of the stripe shaped portions of the JFET portion 3 and the n-type impurity concentration. For that reason, the widths and n-type impurity concentrations of the stripe shaped portions of the JFET portion 3 are set so that the JFET portion 3 is pinched off when the drain voltage Vd is slightly higher than the drain voltage Vd at the time of normal operation. As a result, the JFET portion 3 can be pinched off even at a low drain voltage Vd. In this manner, the JFET portion 3 is immediately pinched off when the drain voltage Vd becomes higher than the drain voltage Vd at the time of normal operation, so that a low saturation current can be maintained, and the tolerance of the SiC semiconductor device due to a load short-circuiting or the like can be further improved.

As described above, the JFET portion 3 and the electric field blocking layer 4 function as the saturation current control layer, and the saturation current control effect is exhibited, thereby being capable of providing the SiC semiconductor device which can further achieve both a low on-resistance and a low saturation current.

Further, with the provision of the electric field blocking layer 4 so as to sandwich the JFET portion 3, the stripe shaped portions of the JFET portion 3 and the electric field blocking layer 4 are alternately and repeatedly formed. For that reason, even if the drain voltage Vd becomes a high voltage, the extension of the depletion layer extending from the lower side to the n⁻-type layer 2 is inhibited by the electric field blocking layer 4, and the depletion layer can be prevented from extending to the trench gate structure. Therefore, an electric field control effect for lowering the electric field applied to the gate insulating film 12 can be exhibited, and the gate insulating film 12 can be inhibited from being broken, so that a highly reliable element with high withstand voltage can be obtained. In order to prevent the extension of the depletion layer into the trench gate structure as described above, the n-type impurity concentrations of the n⁻-type layer 2 and the JFET portion 3 configuring a part of the drift layer can be made relatively high, and the on-resistance can be reduced.

Therefore, the SiC semiconductor device having a vertical MOSFET with low on-resistance and high reliability can be provided.

Next, a method of manufacturing the SiC semiconductor device including the vertical MOSFET with the n channel type inverted trench gate structure according to the present embodiment will be described with reference to cross-sectional views of the SiC semiconductor device during a manufacturing process shown in FIGS. 7A to 7H.

Figure 7A:
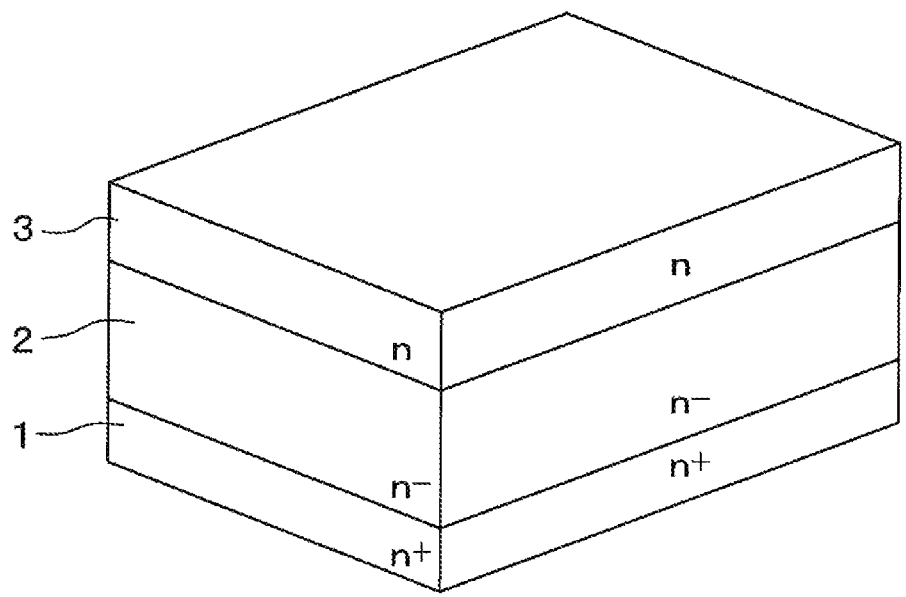
FIG. 7A is a perspective cross-sectional view illustrating a manufacturing process of the SiC semiconductor device shown in FIG. 1.

[Process Shown in FIG. 7A]

First, the n⁺-type substrate 1 is prepared as a semiconductor substrate. Then, the n⁻-type layer 2 made of SiC is formed on the main surface of the n⁺-type substrate 1 by epitaxial growth through a CVD (Chemical Vapor Deposition) device (not shown). At this time, a so-called epitaxial substrate in which the n⁻-type layer 2 is grown in advance on the main surface of the n⁺-type substrate 1 may be used. Then, the JFET portion 3 made of SiC is epitaxially grown on the n⁻-type layer 2.

The epitaxial growth is performed by introducing a gas serving as an n-type dopant, for example, nitrogen gas, in addition to silane and propane serving as raw material gases of SiC.

Figure 7B:
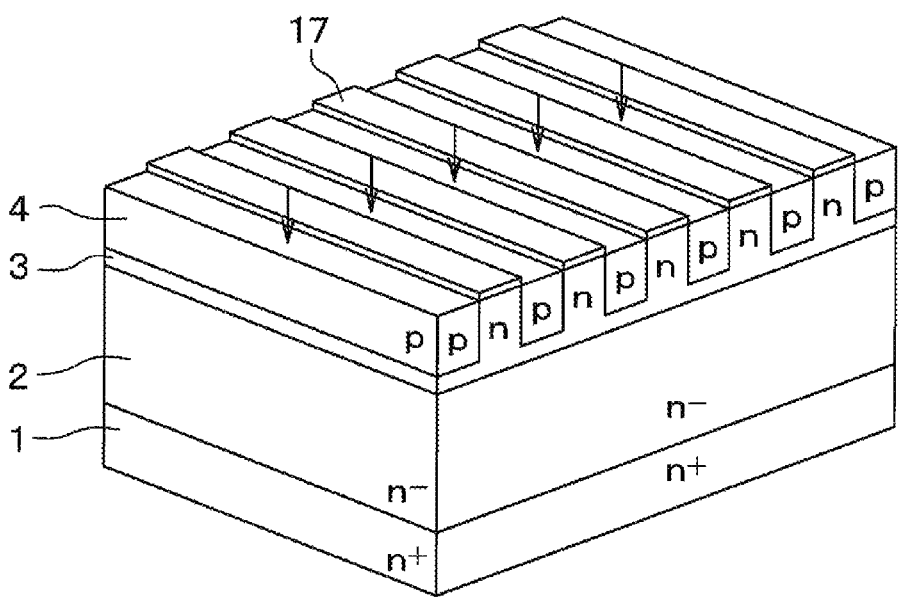
FIG. 7B is a perspective sectional view showing a manufacturing process of the SiC semiconductor device following FIG. 7A.

[Process Shown in FIG. 7B]

After a mask 17 is disposed on a surface of the JFET portion 3, the mask 17 is patterned to open a region where the electric field blocking layer 4 is to be formed. Then, the p-type impurity is ion-implanted to form the electric field blocking layer 4. Thereafter, the mask 17 is removed.

Although the electric field blocking layer 4 is formed by ion implantation in this example, the electric field blocking layer 4 may be formed by a method other than ion implantation. For example, the JFET portion 3 is selectively anisotropically etched to form a recess portion at a position corresponding to the electric field blocking layer 4, a p-type impurity layer is epitaxially grown on the concave portion, and then the p-type impurity layer is flattened at a portion located on the JFET portion 3 to form the electric field blocking layer 4. In this manner, the electric field blocking layer 4 can also be formed by epitaxial growth. When the p-type SiC is epitaxially grown, a gas to be a p-type dopant, for example, trimethylaluminum (hereinafter referred to as TMA) may be introduced in addition to the source gas of SiC.

Figure 7C:
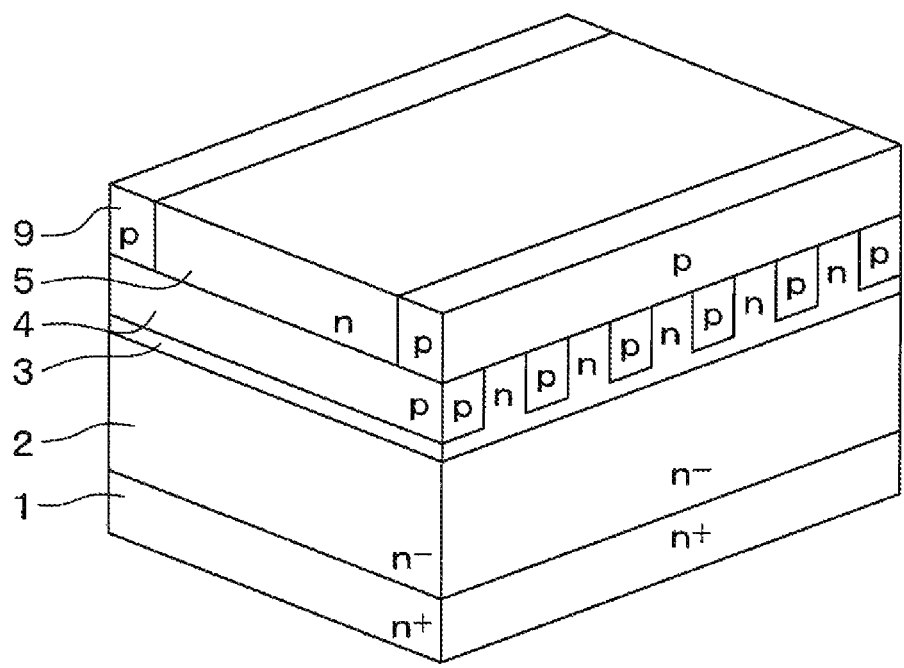
FIG. 7C is a perspective sectional view showing a manufacturing process of the SiC semiconductor device following FIG. 7B.

[Process Shown in FIG. 7C]

Subsequently, n-type SiC is epitaxially grown on the JFET portion 3 and the electric field blocking layer 4 to form the n-type current dispersion layer 5. A mask (not shown) in which a region where the p-type deep layer 9 is to be formed is opened is disposed on the n-type current dispersion layer 5. Thereafter, the p-type deep layer 9 is formed by ion implantation of p-type impurities from above the mask. Although an example in which the p-type deep layer 9 is formed by ion implantation has been described, the p-type deep layer 9 can also be formed by a method other than ion implantation. For example, similarly to the electric field blocking layer 4, the p-type deep layer 9 may be formed by forming a recess portion in the n-type current dispersion layer 5, then epitaxially growing the p-type impurity layer, and flattening the p-type impurity layer.

Figure 7D:
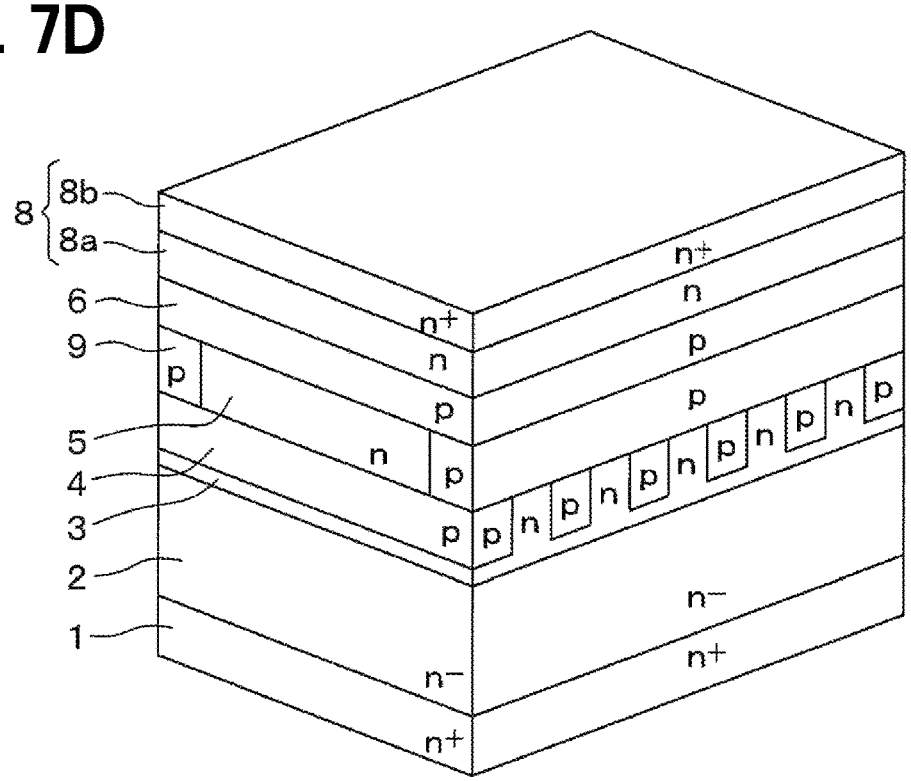
FIG. 7D is a perspective sectional view showing a manufacturing process of the SiC semiconductor device following FIG. 7C.

[Process Shown in FIG. 7D]

The p-type base region 6 and the first source region 8a in the n-type source region 8 are epitaxially grown in this order on the n-type current dispersion layer 5 and the p-type deep layer 9 by using the CVD apparatus (not shown). For example, in the identical CVD apparatus, the temperature inside the growth furnace is raised to a predetermined temperature through a heating process, and then the p-type base region 6 is firstly formed by the epitaxial growth. In the epitaxial growth, the gas as the p-type dopant is introduced along with a carrier gas or a SiC raw material gas. Subsequently, the introduction of the p-type dopant is stopped and the n-type dopant is introduced to form the first source region 8a. However, at this time, the thickness of the first source region 8a is a thickness including the added thickness of the second source region 8b. At this time, the process time is shortened by allowing the first source region 8a to grow epitaxially while maintaining the temperature after the formation of the p-type base region 6 without performing the temperature lowering process.

An n-type impurity is ion-implanted into the surface layer portion of the n-type source region 8 by adopting an ion implantation device. As a result, the second source region 8b having a higher n-type impurity concentration is formed, and the part of the n-type source region 8 located below the second source region 8b is included in the first source region 8a. The first source region 8a can be formed by the epitaxial growth layer, and the second source region 8b can be formed by the ion implantation layer.

In this way, the p-type base region 6 and the n-type source region 8 can be formed with the above-described impurity concentration and the film thickness. In this example, the film thickness and the impurity concentration of each portion are determined as follows.

First, since the p-type base region 6 is a portion where the channel region is set, the film thickness of the p-type base region 6 is set so as to define a channel length while setting the impurity concentration configuring the inverted channel at the time of application of the gate voltage Vg. For that reason, the p-type base region 6 has, for example, a p-type impurity concentration of $3 \times 10^{17}/cm^3$ and a thickness of 0.4 to 0.6 μm.

In the first source region 8a of the n-type source region 8, the film thickness and the n-type impurity concentration are set so as to inhibit the on-resistance Ron from increasing while reducing the saturation current value even when the high drain voltage Vd is applied at the time of a load short-circuiting. For that reason, the first source region 8a has an n-type impurity concentration of, for example, $2.0 \times 10^{16}$ to $1.0 \times 10^{17}/cm^3$ and a thickness of 0.2 μm or more.

The film thickness of the second source region 8b is set to a degree that the entire region of the second source region 8b does not disappear due to a chemical reaction with the source electrode 15 while the impurity concentration is kept to be brought in ohmic contact with the source electrode 15.

As the n-type impurity concentration of the second source region 8b is higher, the ohmic contact is easily performed. However, as in the present embodiment, the n-type source region 8 is epitaxially grown and then p-type impurities are ion-implanted to form the p-type coupling layer 10, and in that case, if the n-type impurity concentration of the n-type source region 8 is too high, the p-type coupling layer 10 cannot be set to a desired concentration. For that reason, in the present embodiment, the n-type impurity concentration of the second source region 8b is set to, for example, $1.0 \times 10^{18}$ to $5.0 \times 10^{19}/cm^3$.

As described above, the source electrode 15 is made of multiple metals, and a portion of the source electrode 15 brought in ohmic contact with the second source regions 8b are made of Ni, for example. In this instance, the portion of the second source region 8b which is brought into contact with Ni becomes an ohmic contact by Ni silicidation, but the second source region 8b is eliminated by the amount silicided. Since the thickness of the Ni silicide produced by the silicidation reaction is about 0.1 μm, the thickness of the second source region 8b is set to 0.1 μm or more to prevent the second source region 8b from disappearing in the entire region by the silicidation reaction.

In a situation of increasing the thickness of the first source region 8a and the second source region 8b included in the n-type source region, it is possible to tolerate variation in the etch back treatment when the interior of the gate trench gate 11 is embedded with Poly-Si and then etched back to form the gate electrode 13. Since the sum of the thickness of the first source region 8a and the second source region 8b may be set to a larger value, the film thickness of the first source region 8a or the film thickness of the second source region 8b is set in the above-mentioned range.

In addition, when the p-type base region 6 and the first source region 8 are formed by epitaxial growth, variations in film thickness of each portion can be reduced. In the p-type base region 6 used for forming the channel region, the channel length can be formed with high accuracy by reducing the film thickness variation. As a result, a variation in a threshold Vth of the vertical MOSFET can be reduced.

For example, the first source region 8a and the second source region 8b can be also formed by epitaxially growing the p-type base region 6 and then implanting an n-type impurity into the p-type base region 6. However, in this case, the film thickness of the p-type base region 6 at the time of epitaxial growth needs to be increased in consideration of the film thickness of the first source region 8a and the second source region 8b formed by ion implantation. The film thickness variation at the time of epitaxial growth becomes larger as the film thickness to be grown becomes thicker, but the variation in the range of ion implantation is not so large, so that the film thickness variation of the p-type base region 6 after ion implantation becomes a variation corresponding to the film thickness of the epitaxially grown film. For that reason, for example, if the film thickness variation of the p-type base region 6 is ±0.21 μm when the film thickness is 1.4 μm, the film thickness variation of the p-type base region 6 is ±0.21 μm even after the first source region 8a and the second source region 8b are formed by ion implantation.

On the other hand, when each portion is formed by epitaxial growth as in the present embodiment, the film thickness variation of the p-type base region 6 does not become a variation including the film thicknesses of the first source region 8a and the second source region 8b, but becomes a variation corresponding to the film thickness of only the p-type base region 6. For example, when the film thickness of the p-type base region 6 is set to 0.4 to 0.6 μm, the film thickness variation is ±0.06 to 0.09 μm. For that reason, each portion is formed by epitaxial growth, thereby being capable of reducing the variation in the film thickness of the p-type base region 6, and being capable of providing the channel length with high accuracy.

In the case where each portion is formed continuously by epitaxial growth, it is preferable that impurity species and the impurity concentration do not change abruptly because a lattice constant depends on the impurity concentration. On the other hand, in the case where the n-type source region 8 is formed over the p-type base region 6 as in the present embodiment, since the first source region 8a is present, the impurity concentration can be prevented from changing abruptly.

This makes it possible to inhibit crystal defects that occur when the impurity concentration changes abruptly.

The second source region 8b with a higher concentration is formed by ion implantation instead of epitaxial growth. Therefore, as in the case of epitaxially growing the second source region 8b with a higher concentration, it is possible to suppress the situation in which the n-type dopant remains inside the epitaxial growth apparatus and contaminates the growth furnace and then the dopant concentration occurs at the time of forming the p-type layer or the n-type layer. Therefore, it is possible to stably control the impurity concentration in the p-type base region 6 and the first source region 8a formed in the epitaxial growth apparatus.

Figure 7E:
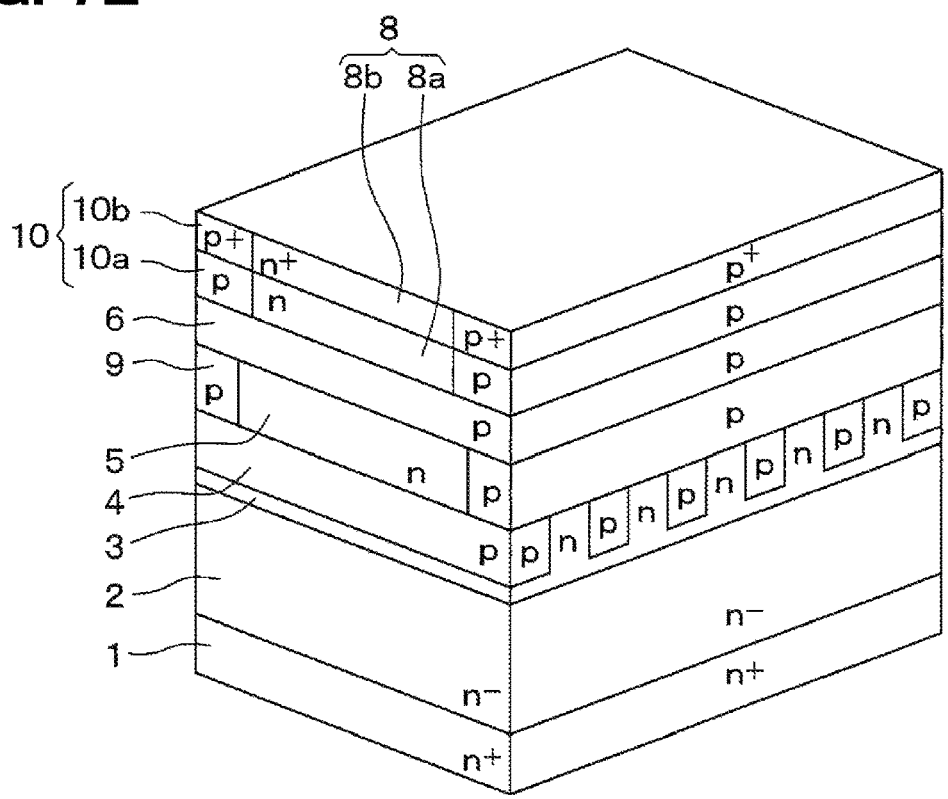
FIG. 7E is a perspective sectional view showing a manufacturing process of the SiC semiconductor device following FIG. 7D.

[Process shown in FIG. 7E]

A mask (not shown) is disposed on the n-type source region 8 so as to open a position where the p-type coupling layer 10 is to be formed. Then, after the p-type impurities are ion-implanted from above the mask, a heat treatment at 1500 degree Celsius or higher is performed for activation. As an element to be ion-implanted, one or both of boron (B) and aluminum (Al) are employed. As a result, the n-type source region 8 can be subjected to ion implantation of the p-type impurity to form the p-type coupling layer 10.

At this time, the second region 10b of the p-type coupling layer 10 needs to be in ohmic contact with the source electrode 15. For that reason, ion implantation is performed at a dose amount of 2 to 10 times the n-type impurity concentration of the second source region 8b. It is considered that if the dose amount is twice as high as the n-type impurity concentration of the second source region 8b, the carrier concentration such that the ohmic contact with the source electrode 15 is performed can be obtained, but in view of the activation rate, the dose is preferably made to be 2 to 10 times as high as the n-type impurity concentration of the second source regions 8b.

As a result, the carrier concentration of the second region 10b, that is, the p-type impurity concentration of the portion functioning as a carrier excluding the portion canceled between the second source region 10b and the second source region 8b or the portion not activated can be, for example, $2.0 \times 10^{18}$ to $1.0 \times 10^{20}/cm^3$. As the impurity concentration of the second region 10b is higher, the ohmic contact with the source electrode 15 becomes easier, but the second source region 8b prior to forming the second region 10b must also be brought into ohmic contact with the source electrode 15. In addition, if the dose amount is large, crystal defects are generated by ion implantation, so that the dose amount needs to be limited to a certain amount. In consideration of those factors, the n-type impurity concentration of the second source region 8b and the p-type impurity concentration of the second source region 10b need to be set. For that reason, the n-type impurity concentration of the second source region 8b and the p-type impurity concentration of the second source region 10b are set to, for example, $1.0 \times 10^{18}$ to $5.0 \times 10^{19}/cm^3$.

On the other hand, since the first region 10a is not a portion brought in ohmic contact with the source electrode 15, the p-type impurity concentration may be lower than that of the second region 10b. In this example, the p-type impurity is ion-implanted at a dose amount of 2 to 10 times as high as the dose amount of the first source region 8a in consideration with the activation rate.

When the p-type coupling layer 10 is formed by ion implantation, from the viewpoint of an output of an ion implantation device, it may be preferable that a sum total film thickness of the n-type source region 8 into which the p-type impurity is implanted is 0.8 μm or less. With the above process, the p-type coupling layer 10 can be formed so as to reach the p-type base region 6 even at the output of a general-purpose ion implantation device, and the mass productivity can be ensured.

Figure 7F:
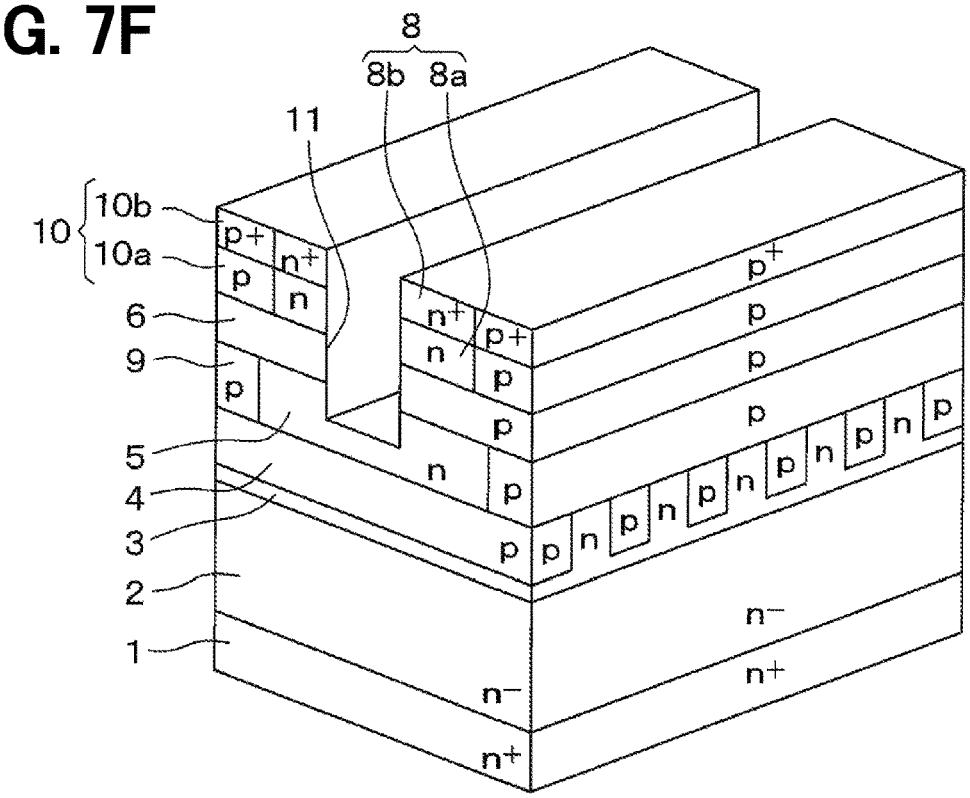
FIG. 7F is a perspective sectional view showing a manufacturing process of the SiC semiconductor device following FIG. 7E.

[Process Shown in FIG. 7F]

After a mask (not shown) is formed on the n-type source region 8 or the like, a region of the mask where the gate trench 11 is to be formed is opened. Then, anisotropic etching such as RIE (Reactive Ion Etching) is performed with the use of the mask to form the gate trenches 11.

Figure 7G:
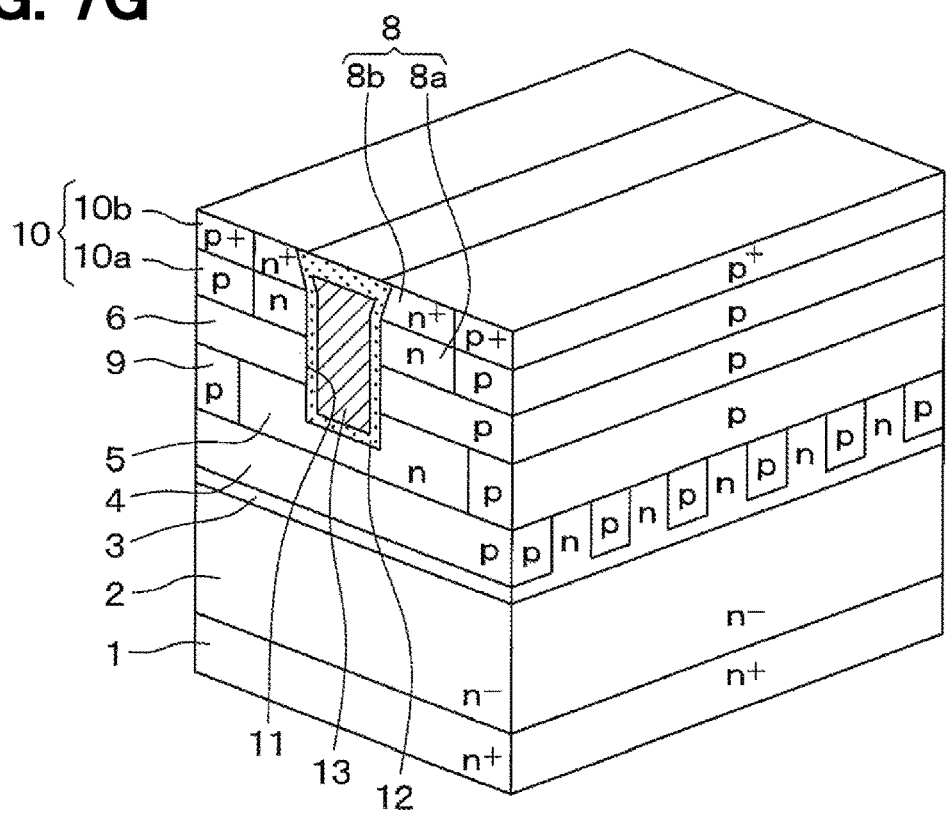
FIG. 7G is a perspective sectional view showing a manufacturing process of the SiC semiconductor device following FIG. 7F.

[Process Shown in FIG. 7G]

Thereafter, after removing the mask, for example, thermal oxidation is performed to form the gate insulating film 12, and the gate insulating film 12 covers the inner wall surface of the gate trench 11 and the surface of the n-type source region 8. Then, a Poly-Si doped with a p-type impurity or an n-type impurity is deposited, and then etched back to leave at least the Poly-Si in the gate trench 11, thereby forming the gate electrode 13. As a result, the trench gate structure is completed.

When such a trench gate structure is formed, if the n-type source region 8 is formed by ion implantation to the whole region, the side surface of the gate trench 11 is tilted when the trench gate structure is formed, due to the influence of the damage during the ion implantation. Therefore, the channel mobility is lowered, and the gate trench 11 becomes wider at the entrance side. Therefore, it is difficult to miniaturize the element.

However, in the present embodiment, the first source region 8a is formed by the epitaxial growth, and only the second source region 8b is formed by ion implantation. For this reason, the tilt of the side surface of the gate trench 11 due to the damage of ion implantation is suppressed, and only the portion in contact with the second source region 8b is in a rounded and tilted state. Therefore, it is possible to suppress the situation in which the gate trench 11 has a wider width at the entrance side, and it is possible to enhance the miniaturization of the element.

Though not shown in the figure, the following processes are performed. In other words, the interlayer insulating film 14 made of, for example, an oxide film is formed to cover the surfaces of the gate electrode 13 and the gate insulating film 12. In addition, contact holes for exposing the n-type source region 8 and the p-type deep layer 9 are provided in the interlayer insulating film 14 with the use of a mask (not shown). Then, an electrode material of a multilayer structure of multiple metals, for example, is formed on the surface of the interlayer insulating film 14, and then the electrode material is patterned to form the source electrode 15 and the gate wire layer. Further, the drain electrode 16 is formed on the rear surface of the n+-type substrate 1. In this manner, the SiC semiconductor device according to the present embodiment is completed.

As described above, in the SiC semiconductor device according to the present embodiment, the n-type source region 8 is configured by the first source region 8a having a relatively low concentration and the second source region 8b having a higher concentration than that of the first source region 8a. The first source region 8a is formed by the epitaxial growth layer, and the second source region 8b is formed by the ion implantation layer. For this reason, it is possible to form the SiC semiconductor device having a structure with enhancement in the short-circuit tolerance or suppression of the tilt of the side surface of the drain gate, and with easier control of the impurity concentration.

Second Embodiment

A second embodiment will be described. The present embodiment is different from the first embodiment in that a non-doped layer is included. Other parts are similar to the first embodiment, and hence only the difference from the first embodiment will be described.

Figure 8:
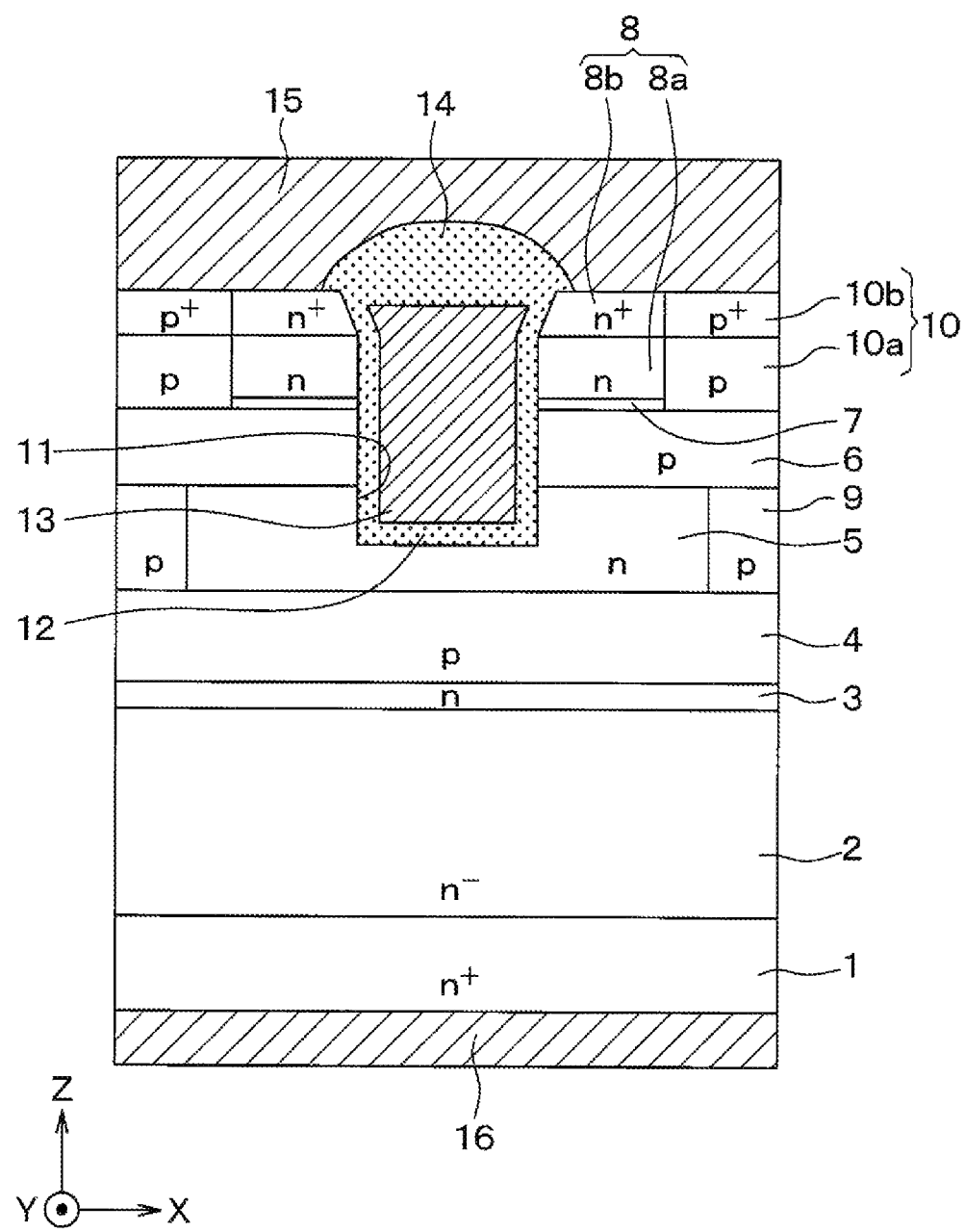
FIG. 8 is a cross-sectional view of a SiC semiconductor device according to a second embodiment.

As shown in FIG. 8, in the SiC semiconductor device according to the present embodiment, the non-doped layer 7 made of SiC is formed on the p-type base region 6, and the n-type source region 8 is formed on the non-doped layer 7.

The non-doped layer 7 is a layer which is not doped with an impurity or a layer in which a carrier concentration is lowered by doping both an n-type impurity and a p-type impurity. A thickness of the non-doped layer 7 is set to 0.05 to 0.2 μm. It may be preferable that both of the n-type impurity and the p-type impurity are not doped in the non-doped layer 7, but even if the non-doped layer 7 is doped, a carrier concentration of the non-doped layer 7 may be set to $1.0 \times 10^{16}/cm^3$ or less. It may also be desirable to set the carrier concentration of the non-doped layer 7 to $1.0 \times 10^{15}/cm^3$ or less. For example, in the non-doped layer 7, an n-type impurity such as nitrogen (N) is set to $1.0 \times 10^{16}/cm^3$ or less, preferably $1.0 \times 10^{15}/cm^3$ or less. In the non-doped layer 7, a p-type impurity such as aluminum is set to $1.0 \times 10^{16}/cm^3$ or less, preferably $1.0 \times 10^{15}/cm^3$ or less. When only one of the p-type impurity and the n-type impurity is doped, the impurity concentration is set to $5.0 \times 10^{15}/cm^3$ or less, and when both the p-type impurity and the n-type impurity are doped, the carrier concentration is set to $5.0 \times 10^{15}/cm^3$ or less by mutually canceling each other.

Figure 9:
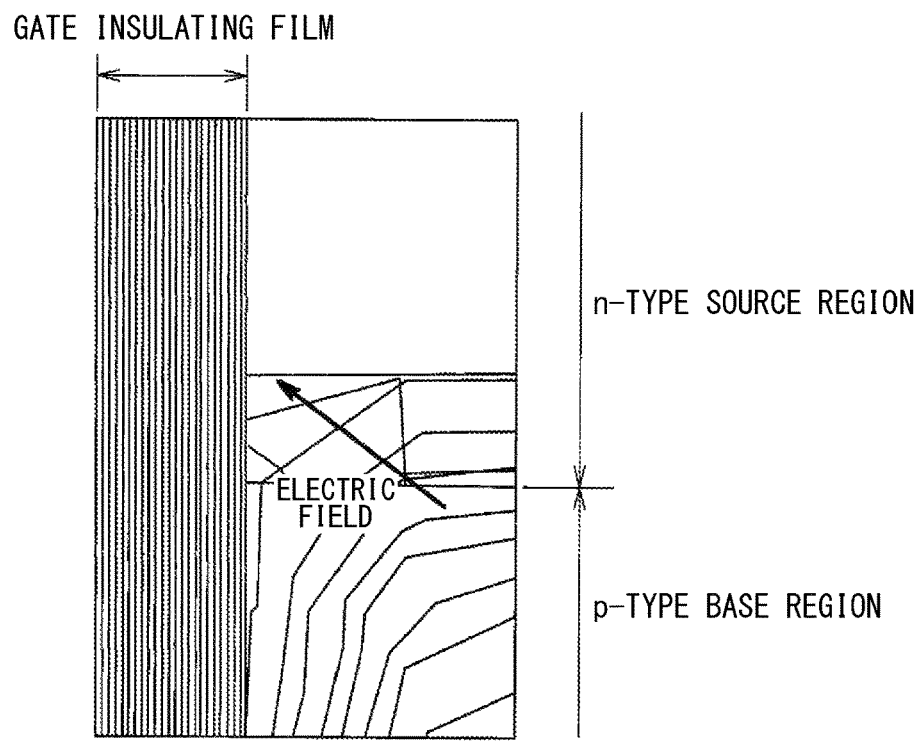
FIG. 9 is a diagram showing a result of examining a voltage distribution during reverse conduction in the case where the entire n-type source region has a high impurity concentration.
Figure 10:
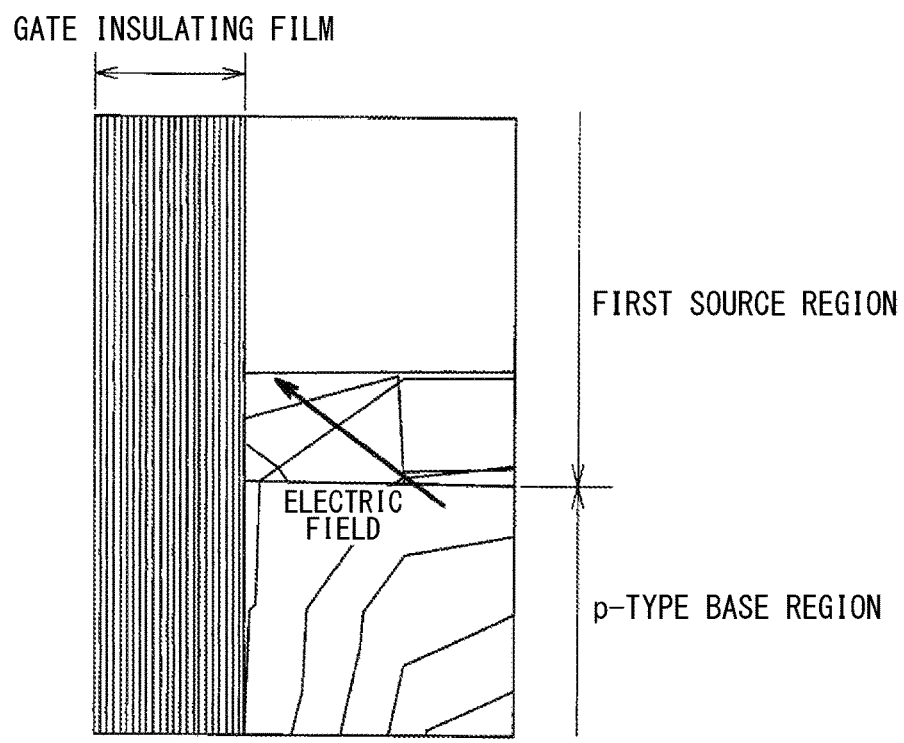
FIG. 10 illustrates a result of examining the voltage distribution during reverse conduction in the case where the first source region is formed in contact with a p-type base region.
Figure 11:
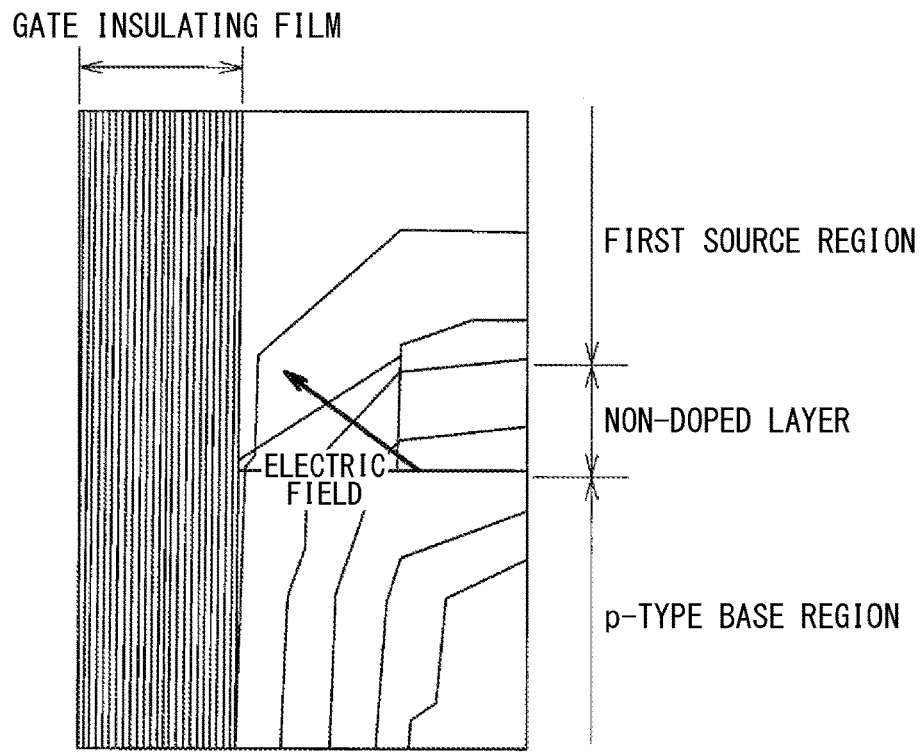
FIG. 11 illustrates the result of examining the voltage distribution at the time of reverse conduction in the case where a non-doped layer is provided.

Further, in the SiC semiconductor device of the present embodiment, the non-doped layer 7 is provided between the p-type base region 6 and the first source region 8a. For that reason, the effect of being able to inhibit the damage to the gate insulating film 12 can be obtained. This effect will be described with reference to FIGS. 9 to 11. FIGS. 9 to 11 show the results of examining the voltage distributions at the time of reverse conduction in the case where the entire n-type source region 8 has a high impurity concentration, in the case where the first source region 8a is formed so as to be in contact with the p-type base region 6, and in the case where the structure of the present embodiment is provided with the non-doped layer 7. The condition at the time of reverse conduction is that the gate voltage Vg is set to 20 V and the drain-source voltage Vds is set to −5 V.

At the time of reverse conduction, the parasitic diode formed in the vertical MOSFET basically functions as a freewheeling diode, and a reflux current flows through the parasitic diode. Holes diffused from the p-type layer side to the n-type layer side of the PN junction configuring the parasitic diode recombine with electronics in the n-type layer. At this time, since a recombination energy is high, a basal plane dislocation (hereinafter referred to as BPD) in the n-type layer formed of an epitaxial film expands, resulting in stacking faults called single Shockley stacking faults (hereinafter referred to as SSSF). Since the BPD is a linear defect, the BPD occupies a small area in the cell region in the SiC semiconductor device and has little influence on the element operation, but when the BPD becomes SSSF, the BPD occupies a large area in the cell region because of stacking faults and the BPD has a large influence on the element operation. For that reason, if the gate voltage Vg is actively applied to the gate voltage Vg even during the reverse conduction to form the channel region and the reflux current flows through the channel region, the reflux current can be dispersed and the recombination energy can be reduced, so that generation of SSSF can be inhibited. However, since the flow of the reflux current through the channel region occurs, a high electric field is applied between the p-type base region 6 and the n-type source region 8, causing hot electrons and causing damage to the gate insulating film 12.

More specifically, as shown in FIG. 9, when the n-type source region 8 having a high concentration in the entire region is formed so as to be in contact with the p-type base region 6, a potential distribution is generated at the PN junction portion at the time of reverse conduction, and a high electric field is applied to the n-type source region 8. When the n-type source region 8 is formed so as to be in contact with the p-type base region 6, carriers existing in the portion of the n-type source region 8 which is in contact with the p-type base region 6 are accelerated by the electric field by an electric field applied to the n-type source region 8, and become hot electrons. A situation that the hot electrons collide with the gate insulating film 12, and damage the gate insulating film 12 occurs. In particular, when the n-type impurity concentration is increased in the entire n-type source region 8, this situation becomes more obvious.

On the other hand, when the first source region 8a is provided in the n-type source region 8 even if the non-doped layer 7 is not provided, the p-type base region 6 and the first source region 8a configure a PN junction. As described above, when the first source region 8a is provided, even if the non-doped layer 7 is not provided, the n-type impurity concentration of the first source region 8a is relatively low, so that the electric field applied to the PN junction can be inhibited to some extent. In other words, as shown in FIG. 10, a distance between equipotential lines at the PN junction portion is wider than that in FIG. 9, and the electric field can be inhibited to some extent by the structure having the first source region 8a.

However, in the case where the non-doped layer 7 is not formed, the PN junction formed by the p-type base region 6 and the first source region 8a is formed, so that the above-mentioned situation can be caused by generation of the hot electrons although the electric field is reduced as compared with the case of FIG. 9.

On the other hand, when the non-doped layer 7 is provided between the p-type base region 6 and the first source region 8a as in the present embodiment, as shown in FIG. 11, equipotential lines can be received by the non-doped layer 7, and the electric field in the n-type source region 8 can be weakened. Although the electric field is generated in the non-doped layer 7, almost no carriers exist in the non-doped layer 7. Therefore, with the provision of the non-doped layer 7, the gate insulating film 12 can be inhibited from being damaged due to the hot electrons at the time of reverse conduction.

Therefore, when reverse conduction is performed, the generation of hot electrons can be inhibited while the generation of SSSF is inhibited by actively causing the reflux current to flow not only through the parasitic diodes but also through the channel region, and the gate insulating film 12 can be inhibited from being damaged.

Next, a method of manufacturing the SiC semiconductor device according to the present embodiment will be described. The SiC semiconductor device described in the present embodiment, in addition to the manufacturing method described in the first embodiment, is manufactured by a step of forming the non-doped layer 7 after the formation of the p-type base region 6 and prior to the formation of the n-type source region 8.

The non-doped layer 7 is formed by using the epitaxial growth apparatus used for forming the p-type base region 6 and the first source region 8a. Subsequently, the non-doped layer 7 is formed by successively performing epitaxial growth in a state in which the introduction of dopant gases of both the p-type dopant and the n-type dopant into the epitaxial growth apparatus is stopped, after the p-type base region 6 is formed. At this time, the process time is shortened by forming the non-doped layer 7 while maintaining the temperature after the formation of the p-type base region 6 without performing the temperature lowering process. At this time, the process time is shortened by maintaining the temperature without performing the temperature lowering process after the formation of the non-doped layer 7 even in the subsequent epitaxial growth of the first source region 8a.

The film thickness of the non-doped layer 7 can be arbitrarily set, but if the film thickness is too thick, the on-resistance Ron becomes high. For that reason, the thickness is set to 0.05 to 0.2 µm. It may be preferable that the non-doped layer 7 is basically free of impurities, but the carrier concentration may be as low as possible. In particular, when the non-doped layer 7 is successively formed after the formation of the p-type base region 6, the p-type impurity remaining in the atmosphere may be introduced or nitrogen present in the atmosphere may be introduced as the n-type impurity. Even in such a case, the impurity concentration may be as low as possible. In the case where it is assumed that an impurity of one conductivity type can be introduced, an impurity of the other conductivity type is intentionally introduced and both of the impurities are doped and mutually cancelled so that the carrier concentration may be lowered. For example, when only one of the p-type impurity and the n-type impurity is doped, the impurity concentration is set to $1.0 \times 10^{16}/cm^3$ or less, and when both the impurities are doped, the carrier concentration is set to $1.0 \times 10^{16}/cm^3$ or less while mutually canceling those impurities.

Since the p-type coupling layer 10 needs to be connected to the p-type base region 6 at the formation of the p-type coupling layer 10 in a situation of forming the non-doped layer 7, the p-type impurity is also implanted into the non-doped layer 7, and the implanted portion also becomes the p-type coupling layer 10.

In the SiC semiconductor device of the present embodiment, the non-doped layer 7 is provided between the p-type base region 6 and the first source region 8a. This makes it possible to inhibit the generation of hot electrons and to inhibit the damage to the gate insulating film 12.

Third Embodiment

A third embodiment will be described. In the present embodiment, the method of measuring the film state of the n-type layer in the first and second embodiments.

In the SiC semiconductor device described in the first and second embodiments, the n-type current dispersion layer 5 and the first source region 8a are epitaxially grown as the n-type layer. After the formation of these n-type layers, the measurement of the n-type impurity concentration as the film state of the n-type layer is performed.

However, the surface electronic state of the n-type layer is not stabilized immediately after the n-type layer is epitaxially grown, but is stabilized after a certain time period has been elapsed. Therefore, it is required to wait for a predetermined time after the epitaxial growth for enhancing the accuracy in the measurement of the n-type impurity concentration. Specifically, it is possible to measure the n-type impurity concentration based on the measurement flow of the n-type impurity concentration illustrated in FIG. 12.

Figure 12:
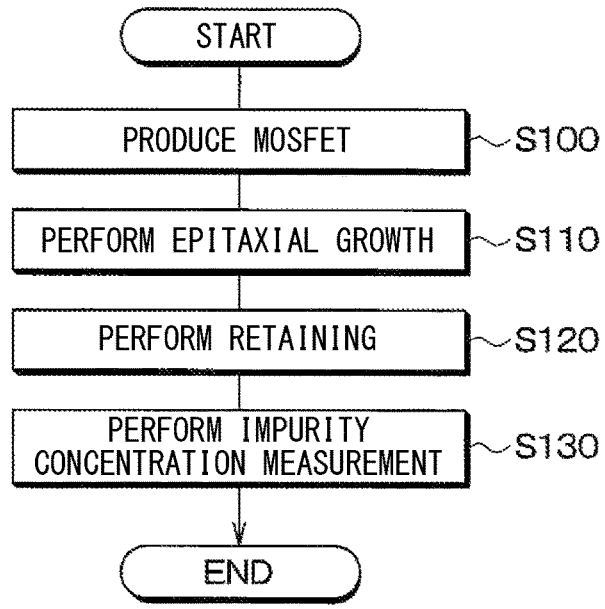
FIG. 12 illustrates a measurement flow of the n-type impurity concentration described in the third embodiment.

Initially, the production of MOSFET is performed as shown in S100 of FIG. 12. The production of the MOSFET described herein is a process before the process of forming the n-type layer (hereinafter referred to as a measurement target layer) as a measurement target of the n-type impurity concentration during the process of manufacturing a vertical MOSFET in the SiC semiconductor described in the first and second embodiments. As the first embodiment is taken as an example, in a situation where the measurement target layer is the n-type current dispersion layer 5, the steps until the step of forming the electric field blocking layer 4 are performed as shown in FIG. 7B. In a situation where the measurement target layer is the first source region 8a, the steps until the formation of the p-type base region 6 in FIG. 7D are performed.

Subsequently, the process of growing the measurement target layer epitaxially is performed as shown in S110. As a result, for example, the n-type current dispersion layer 5 or the first source region 8a to be a measurement target is epitaxially grown. Subsequently, after the epitaxial growth, as shown in S120, a retaining process of retaining the measurement target for 10 hours or more in the air atmosphere is performed as an electronic stabilizing process. Subsequently, the process proceeds to S130 and the n-type impurity concentration of the measurement target layer is performed.

Figure 13:
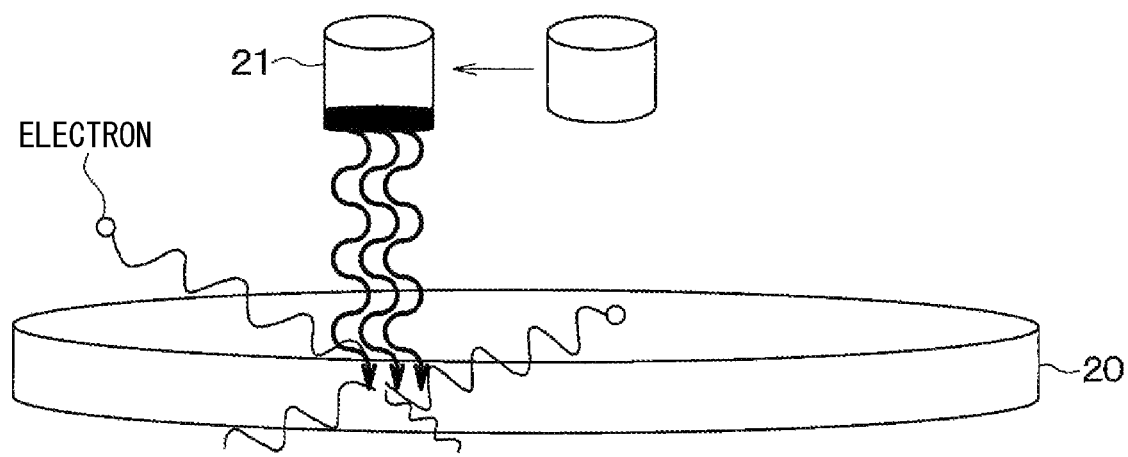
FIG. 13 illustrates a measurement flow of the n-type impurity concentration described in the third embodiment.

The measurement of the n-type impurity concentration in the n-type layer can be performed by using a technique called non-contact CV concentration evaluation. As shown in FIG. 13, a potential probe 21 is arranged on a wafer 20 after the wafer 20 on which the n-type layer is formed is continuously charged with a corona discharge to charge the surface of the n-type layer. This is a method or technique of measuring the n-type impurity concentration from the QV curve by repeating the measurement of the surface potential with the potential probe 21. Using this method, it is possible to measure the n-type impurity concentration of the measurement target layer after the epitaxial growth.

Figure 14:
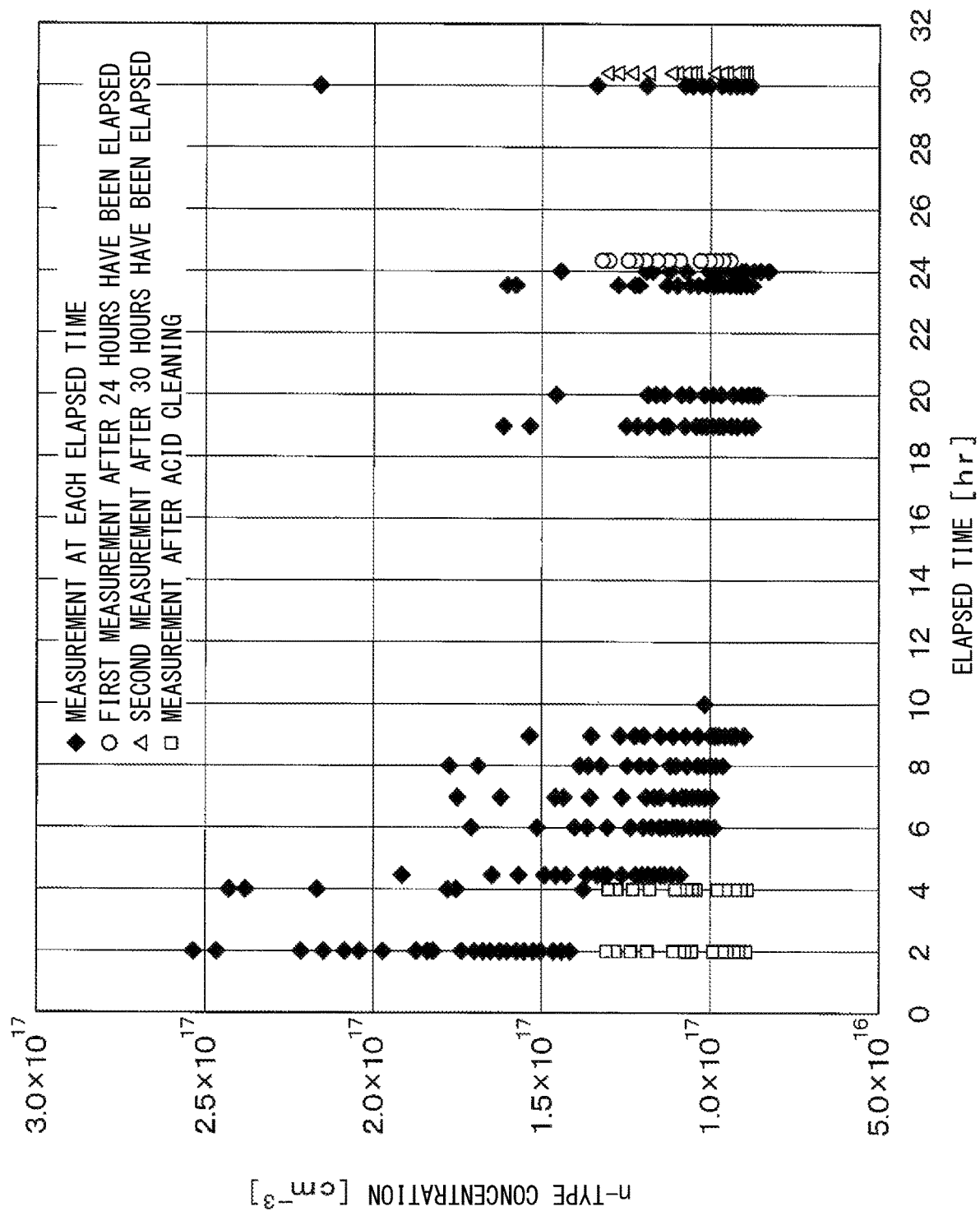
FIG. 14 illustrates the relationship between the time of exposure to the atmosphere after growing the n-type layer epitaxially and the measurement result of the n-type concentration.

However, immediately after the epitaxial growth, it was confirmed that the surface electronic state of the n-type layer to be the measurement target layer was not stable, and the n-type impurity concentration cannot be measured with enhanced accuracy. Specifically, the relationship between the elapsed time after the epitaxial growth of the n-type layer and the n-type impurity concentration was examined by using the method of non-contact CV concentration evaluation. FIG. 14 shows the results.

As shown in FIG. 14, after the epitaxial growth of the n-type layer, in a situation where the n-type layer is only exposed to the atmosphere after the epitaxial growth, the n-type impurity concentration gradually decreases with the elapsed time. The concentration of the n-type impurity became constantly stable as the elapsed time reached 10 hours or more, or 18 hours or more such as about 24 hours. The change in the n-type impurity concentration in relation to the elapsed time had been examined multiple times. However, since the non-contact CV concentration evaluation is performed, there is a concern about its influence. Therefore, the concentration of n-type impurities was also confirmed when the measurement by non-contact CV concentration evaluation was performed as the first time 24 hours after the formation of the n-type layer and as the second time after 30 hours had elapsed. However, the value was about the same as when it was performed multiple times. It can be said that the method of changing the n-type impurity concentration is not affected by the implementation of the non-contact CV concentration evaluation.

Immediately after the epitaxial growth, the surface electronic state of the n-type layer to be the measurement target layer was not stable, and the n-type impurity concentration cannot be measured with enhanced accuracy because the n-type impurity concentration is higher. On the other hand, if the n-type layer is maintained, retained or held in the atmosphere for 10 hours or more, the surface electronic state of the n-type layer to be the measurement target layer is stabilized, and the n-type impurity concentration can be measured with enhanced accuracy.

As described above, the non-contact CV concentration evaluation does not perform the measurement immediately after the epitaxial growth while measuring the n-type impurity concentration of the measurement target layer. In the electron stabilizing process, the measurement is performed after performing the retaining step for retaining the measurement target layer 10 hours or more under the atmosphere. As a result, it is possible to measure the n-type impurity concentration with enhanced accuracy.

However, in a situation where the n-type impurity concentration of the measurement target layer is measured after the retaining process, the manufacturing process may be lengthened and the manufacturing cost may increase.

Therefore, the inventors in the present application had diligently studied to shorten the time required for measuring the state film of the n-type layer. As a result, it was found that, by acid cleaning the surface after the epitaxial growth of the n-type layer, the state of the n-type impurity concentration is stabilized in the same manner as a situation in which the n-type layer is exposed to the atmosphere 10 hours or more after the epitaxial growth. FIG. 14 also indicates the results of performing the acid cleaning and the non-contact CV concentration evaluation without performing the retaining process after the epitaxial growth.

Figure 15:
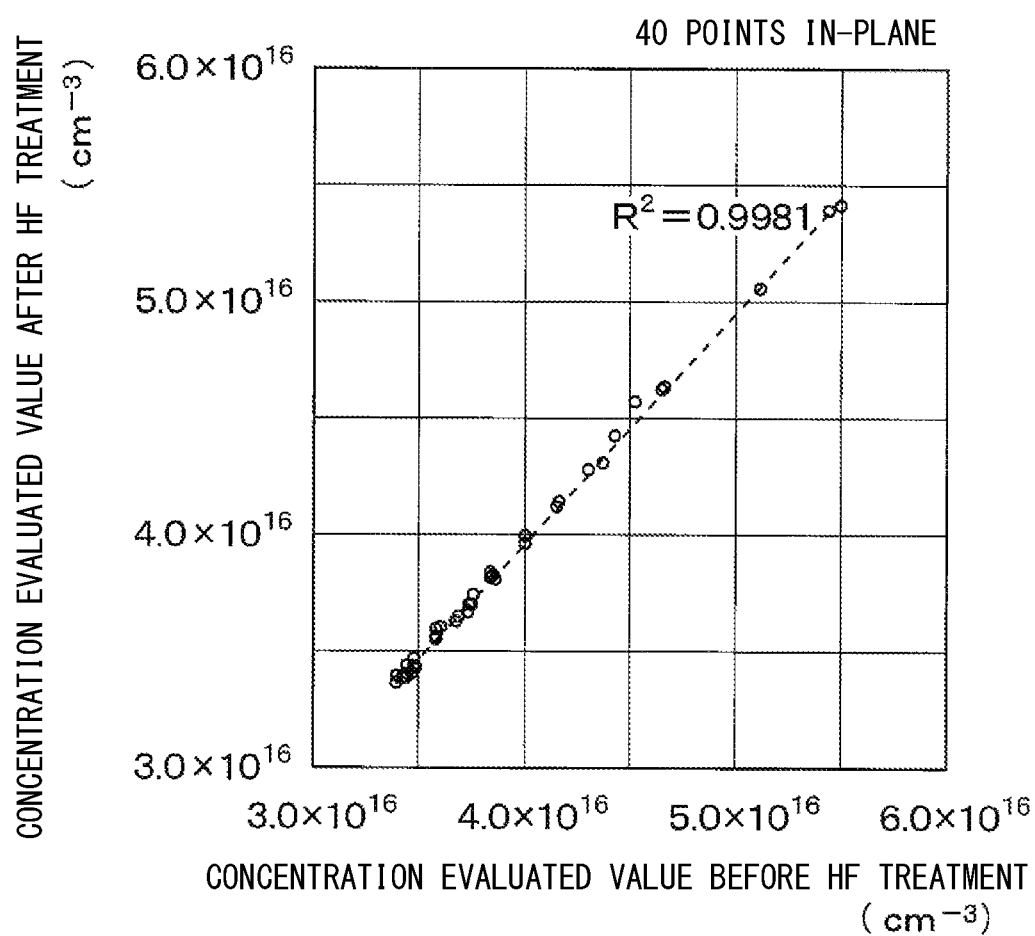
FIG. 15 illustrates the relationship between concentration evaluated values before and after HF treatment.

As checking the n-type impurity concentration in a situation of performing the acid cleaning immediately after the epitaxial growth of the n-type layer, it was confirmed that the values of the n-type impurity concentration were equivalent to the ones in a situation of exposing the n-type layer to the atmosphere 24 hours or more, as indicated by white squares in FIG. 13. As the acid cleaning, SC-2 (hydrochloric acid hydrogen peroxide aqueous solution), SPM (hydrogen peroxide aqueous solution), ozone cleaning and the like can be applied. In a situation of performing acid-cleaning, an oxide film may be formed on the SiC surface, but the presence or absence of the oxide film is arbitrary. In particular, in order to investigate the influence of the presence or absence of the oxide film, the variation in the n-type impurity concentration is examined in a situation of performing the acid-cleaning after the epitaxial growth of the n-type layer and in a situation of re-examining the n-type impurity concentration after performing HF process subsequent to performing the acid-cleaning after the epitaxial growth of the n-type layer. The HF process may also be referred to as HF treatment or hydrofluoric treatment. As a result, as shown in FIG. 15, there is no variation between the n-type impurity concentration examined at the first time and the n-type impurity concentration examined at the second time. It can be observed that, in the non-contact CN concentration evaluation on SiC, the absence or presence of the oxide film is arbitrary, and the n-type impurity concentration can be measured without influence of the absence or presence of the oxide film. The HF process was performed so that even though the oxide film was formed, it could be removed. However, even though the oxide film is not formed from the beginning, the n-type impurity concentration can be measured based on the non-contact CV concentration evaluation.

Figure 16:
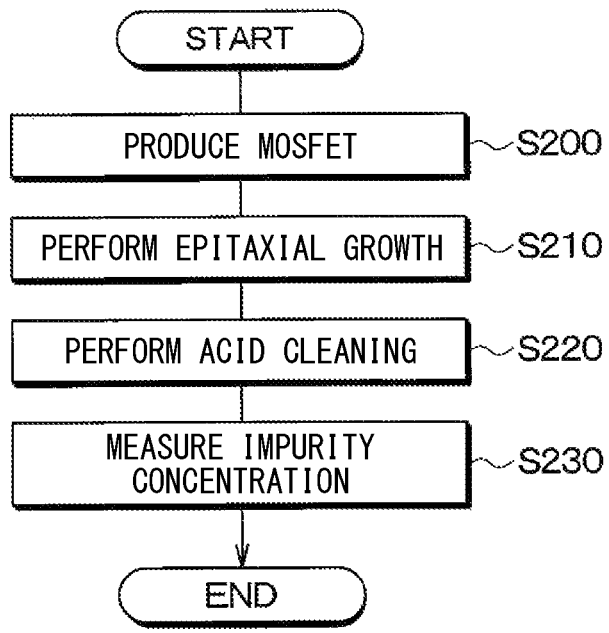
FIG. 16 illustrates a measurement flow of the n-type impurity concentration described in other example of the third embodiment.

By performing the acid cleaning after the epitaxial growth of the n-type layer as described above, it is possible to measure the value after the variation in the n-type impurity concentration is stabilized even though the elapsed time period is shorter. Even immediately after the n-type current dispersion layer 5 and the first source region 8a are epitaxially grown, the n-type impurity concentration can be measured after performing the acid cleaning. Therefore, it is possible to perform the measurement with enhanced accuracy. In a situation of performing such acid cleaning, the measurement of the n-type impurity concentration is performed based on the measurement flow illustrated in FIG. 16 in replacement of FIG. 12. In S200, S210, the processes identical to S100, S110 are performed, and then the acid cleaning is performed as the electron stabilizing process. Subsequently, in S230, the n-type impurity concentration is measured by the method identical to S130 in FIG. 12. Since the time for starting the measurement of the n-type impurity concentration at this time, that is, the elapsed time from the completion of the acid cleaning is arbitrary, the elapsed time may be shorter.

Fourth Embodiment

A fourth embodiment will be described. The third embodiment describes, for example, the n-type current dispersion layer 5 and the first source region 8a being the n-type layer. However, it is applicable to any of the n-type layers in a situation where the n-type impurity concentration is measured after the epitaxial growth of the n-type layer. Herein, a situation will be described in which the n-type impurity concentration of the n⁻-type layer 2 is measured after the epitaxial growth of the n⁻-type layer 2 on the main surface of the n⁺-type substrate 1.

Figure 17:
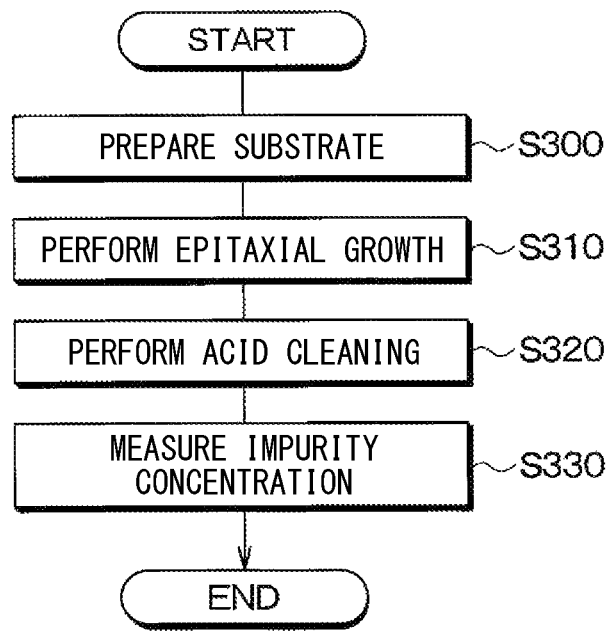
FIG. 17 is a diagram showing a measurement flow of the n-type impurity concentration described in the fourth embodiment.

It is possible to measure the n-type impurity concentration based on the measurement flow of the n-type impurity concentration illustrated in FIG. 17, in a situation where the n-type impurity concentration of the n⁻-type layer 2 is measured.

As indicated in S300 of FIG. 17, a SiC bulk substrate, that is, the n⁺-type substrate 1 is prepared. Subsequently, as indicated in S310, the n⁻-type layer 2 is epitaxially grown on the main surface of the n⁺-type substrate 1. In S320, S330, the measurement of the n-type impurity concentration is measured after the acid-cleaning similar to S220, S230 in FIG. 16.

Even in a situation where the n-type impurity concentration of the n⁻-type layer 2 after epitaxially growing the n⁻-type layer 2 on the main surface of the n⁺-type substrate 1, it is possible to measure the n-type impurity concentration with enhanced accuracy regardless of the time period elapsed from the epitaxial growth through the acid cleaning.

Other Embodiments

While the present disclosure has been described in accordance with the embodiment described above, the present disclosure is not limited to the embodiment and includes various modifications and equivalent modifications. In addition, various combinations and forms, and further, other combinations and forms including only one element, or more or less than these elements are also within the scope and the scope of the present disclosure (1) For example, in the above embodiments, the JFET portion 3 and the electric field blocking layer 4 are provided, and the n-type current dispersion layer 5 is provided, and the JFET portion 3 and the n-type current dispersion layer 5 configure a part of the drifting layer. However, the above configuration is merely an exemplary configuration of the vertical MOSFET, and a structure without the JFET portion 3 and the electric field blocking layer 4, a structure without the n-type current dispersion layer 5, or a structure without both of those components may be used.

(2) In addition, various dimensions such as the impurity concentration, thickness, width, and the like of each portion configuring the SiC semiconductor devices described in the above embodiment are shown by way of example only. For example, the first region 10a may be formed to a position deeper than the first source region 8a, or the second region 10b may be formed to a position deeper than the second source region 8b and the non-doped layer 7.

(3) In the above embodiments, the p-type deep layer 9 and the p-type coupling layer 10 are formed separately, but those layers may be formed of the same p-type layer. For example, a deep trench is formed from the surface of the n-type source region 8 through the non-doped layer 7, the p-type base region 6, and the n-type current dispersion layer 5 to reach the electric field blocking layer 4, and a p-type layer is formed so as to be buried in the deep trench. Alternatively, p-type impurities are ion-implanted from the surface of the n-type source region 8 to form a p-type layer that reaches the electric field blocking layer 4 from the non-doped layer 7 or the p-type base region 6 and the n-type current dispersion layer 5. In this manner, the p-type deep layer 9 and the p-type coupling layer 10 can be formed by the p-type layer.

(4) In the above embodiments, the structure in which the n-type source region 8 is divided into two regions having different impurity concentrations, that is, the first source region 8a and the second source region 8b, has been described, but those regions may not be clearly divided. In other words, it is sufficient that the p-type base region 6 side of the n-type source region 8 has a lower impurity concentration than that of the surface side which is brought into contact with the source electrode 15, and the surface side has a higher impurity concentration which is brought into ohmic contact with the source electrode 15. In other words, there may be a concentration gradient such that the impurity concentration of the first source region 8a or the second source region 8b gradually increases towards the source electrode 15.

(5) The third and fourth embodiments describe that the n-type impurity concentration of the n-type current dispersion layer 5, the first source region 8a or the n⁻-type layer 2 is taken as one of the examples for measuring the n-type impurity after the epitaxial growth.

In particular, the third embodiment describes that the epitaxial growth layer is previously formed on the SiC bulk substrate, and then the ion implantation is performed and subsequently the n-type layer such as the n-type current dispersion layer or the first source region 8a to be the measurement target layer is formed. In a situation where the ion implantation is performed on the epitaxial growth layer formed in a lower layer and then the epitaxial growth of the SiC layer to be the measurement target layer is performed, it is possible to measure the n-type impurity concentration through the non-contact CN concentration evaluation.

The fourth embodiment describes a situation in which an epitaxial growth layer is formed on the n⁻-type layer 2, which is a SiC layer of the measurement target layer on the SiC bulk substrate. Even in a situation where the epitaxial growth of the measurement target layer is directly performed on the SiC bulk substrate, it is possible to perform the measurement of the n-type impurity concentration through the non-contact CV concentration evaluation.

(6) In the above embodiment, an n-channel type vertical MOSFET in which the first conductivity type is n-type and the second conductivity type is p-type is exemplified, but a p-channel type vertical MOSFET in which the conductivity types of the respective constituent elements are inverted may be used. In the above description, the vertical MOSFET is exemplified as the semiconductor device, but the present disclosure can be applied to an IGBT having a similar structure as that of the semiconductor device. In the case of the n-channel type IGBT, the conductivity type of the n⁺-type substrate 1 is changed from the n-type substrate to the p-type substrate in each of the above embodiments, and the structures and manufacturing methods are the same as those in each of the above embodiments, except that the conductivity type of the n⁺-type substrate 1 is changed from the n-type substrate to the p-type substrate.

The process of the flowchart or the flowchart described in this application includes a plurality of sections, and each section is expressed as, for example, S100. Each section may be divided into several subsections, while several sections may be combined into one section. Furthermore, each section thus configured may be referred to as a device, module, or means.

What is claimed is:

1. A silicon carbide semiconductor device comprising:
 an inverted semiconductor element including:
  a substrate made of silicon carbide having a first conductivity type or a second conductivity type;
  a drift layer disposed on the substrate and made of silicon carbide having the first conductivity type with an impurity concentration lower than the substrate;
  a base region made of silicon carbide having the second conductivity type and disposed on the drift layer;
  a source region made of silicon carbide having the first conductivity type with a first conductivity type impurity concentration higher than the drift layer and disposed on the base region;
  a plurality of trench gate structures each of which has a gate trench, a gate insulating film and a gate electrode, the gate trench disposed deeper than the base region from a surface of the source region, the gate insulating film covering an inner wall of the gate trench, the gate electrode disposed on the gate insulating film, the trench gate structures aligned in a stripe shape along a single direction corresponding to a longitudinal direction;
an interlayer insulating film covering the gate electrode and the gate insulating film, and having a contact hole;
a source electrode in ohmic-contact with the source region through the contact hole; and
a drain electrode disposed at a rear surface of the substrate,
wherein the source region includes:
a first source region that has an epitaxial growth layer disposed at the base region; and
a second source region that is in contact with the source electrode, and that has an ion implanted layer having the first conductivity type with the first conductivity type impurity concentration higher than the first source region, wherein
the first source region is in contact with the base region,
the first source region has a thickness of 0.2 μm to 0.5 μm and an impurity concentration of $2.0 \times 10^{16}$ to $1.0 \times 10^{17}/cm^3$, and
the second source region has a thickness of 0.1 μm to 0.2 μm and a second conductivity type impurity concentration of $1.0 \times 10^{18}$ to $5.0 \times 10^{19}/cm^3$.

2. The silicon carbide semiconductor device according to claim 1,
wherein the gate trench is rounded and tilted at a portion corresponding to the second source region.

3. A silicon carbide semiconductor device comprising:
an inverted semiconductor element including:
a substrate made of silicon carbide having a first conductivity type or a second conductivity type;
a drift layer disposed on the substrate and made of silicon carbide having the first conductivity type with an impurity concentration lower than the substrate;
a base region made of silicon carbide having the second conductivity type and disposed on the drift layer;
a source region made of silicon carbide having the first conductivity type with a first conductivity type impurity concentration higher than the drift layer and disposed on the base region;
a plurality of trench gate structures each of which has a gate trench, a gate insulating film and a gate electrode, the gate trench disposed deeper than the base region from a surface of the source region, the gate insulating film covering an inner wall of the gate trench, the gate electrode disposed on the gate insulating film, the trench gate structures aligned in a stripe shape along a single direction corresponding to a longitudinal direction;
an interlayer insulating film covering the gate electrode and the gate insulating film, and having a contact hole;
a source electrode in ohmic-contact with the source region through the contact hole; and
a drain electrode disposed at a rear surface of the substrate,
wherein the source region includes:
a first source region that has an epitaxial growth layer disposed at the base region; and
a second source region that is in contact with the source electrode, and that has an ion implanted layer having the first conductivity type with the first conductivity type impurity concentration higher than the first source region, and
wherein a non-doped layer is disposed between the base region and the source region, and has a carrier concentration of $1.0 \times 10^{16}/cm^3$ and a thickness of 0.05 μm to 0.2 μm.

4. The silicon carbide semiconductor device according to claim 3,
wherein the first source region has a thickness of 0.2 μm to 0.5 μm and an impurity concentration of $2.0 \times 10^{16}$ to $1.0 \times 10^{17}/cm^3$, and
wherein the second source region has a thickness of 0.1 μm to 0.2 μm and a second conductivity type impurity concentration of $1.0 \times 10^{18}$ to $5.0 \times 10^{19}/cm^3$.

5. The silicon carbide semiconductor device according to claim 3,
wherein the gate trench is rounded and tilted at a portion corresponding to the second source region.

6. A method for manufacturing a silicon carbide semiconductor device including an inverted semiconductor element, the method comprising:
preparing a substrate made of silicon carbide having a first conductivity type or a second conductivity type;
forming a drift layer disposed on the substrate and made of silicon carbide having the first conductivity type with an impurity concentration lower than the substrate;
forming a base region made of silicon carbide having the second conductivity type on the drift layer;
forming a source region made of silicon carbide having the first conductivity type with a first conductivity type impurity concentration higher than the drift layer on the base region, the source region having
a first source region arranged at the base region, and
a second source region arranged on the first source region and having an impurity concentration higher than the first source region;
forming a plurality of trench gate structures by
forming a plurality of gate trenches deeper than the base region from a surface of the source region and aligned in a stripe shape along a single direction corresponding to a longitudinal direction,
forming a gate insulating film at an inner surface of each of the gate trenches, and
forming a gate electrode on the gate insulating film;
forming a source electrode electrically connected to the base region; and
forming a drain electrode at a rear surface of the substrate,
wherein, in the forming of the base region, the base region is formed by epitaxial growth, and
wherein, in the forming of the source region, the first source region is formed by the epitaxial growth at a surface of the base region to have a thickness of 0.2 μm to 0.5 μm and an impurity concentration of $2.0 \times 10^{16}$ to $1.0 \times 10^{17}/cm^3$, and then the second source region is formed by ion implantation of first conductivity type impurities to the first source region to have a thickness of 0.1 μm to 0.2 μm and a second conductivity type impurity concentration of $1.0 \times 10^{18}$ to $5.0 \times 10^{19}/cm^3$.

7. A method for manufacturing a silicon carbide semiconductor including an inverted semiconductor element, the method comprising:
preparing a substrate made of silicon carbide having a first conductivity type or a second conductivity type;

forming a drift layer disposed on the substrate and made of silicon carbide having the first conductivity type with an impurity concentration lower than the substrate;

forming a base region made of silicon carbide having the second conductivity type on the drift layer;

forming a non-doped layer having a carrier concentration of $1.0\times10^{16}$/cm$^3$ and a thickness of 0.05 μm to 0.2 μm on the base region;

forming a source region made of silicon carbide having the first conductivity type with a first conductivity type impurity concentration higher than the drift layer on the non-doped region, the source region having a first source region arranged at the base region, and a second source region arranged on the first source region and having an impurity concentration higher than the first source region;

forming a plurality of trench gate structures by forming a plurality of gate trenches deeper than the base region from a surface of the source region and aligned in a stripe shape along a single direction corresponding to a longitudinal direction, forming a gate insulating film at an inner surface of each of the gate trenches, and forming a gate electrode on the gate insulating film;

forming a source electrode electrically connected to the base region; and forming a drain electrode at a rear surface of the substrate, wherein, in the forming of the base region, the base region is formed by epitaxial growth, and wherein, in the forming of the source region, the first source region is formed by the epitaxial growth, and then the second source region is formed by ion implantation of first conductivity type impurities to the first source region.

8. The method according to claim 7, wherein the forming of the base region and the forming of the non-doped layer are continuously performed while a temperature is maintained in an identical epitaxial growth apparatus.

9. The method according to claim 7, wherein processes from the forming of the base region until the forming of the first source region are continuously performed while a temperature is maintained in an identical epitaxial growth apparatus.

10. A method for manufacturing a silicon carbide semiconductor including an inverted semiconductor element, the method comprising:

growing epitaxially an n-type silicon carbide layer as a measurement target layer;

stabilizing a surface electronic state of the n-type silicon carbide layer after growing epitaxially the n-type silicon carbide layer; and measuring n-type impurity concentration of the n-type silicon carbide layer by measuring a surface potential of the n-type silicon carbide layer after coating an electric charge to charge a surface of the n-type silicon carbide layer, subsequent to stabilizing the surface electronic state of the n-type silicon carbide layer.

11. The method according to claim 10, wherein, in the stabilizing of the surface electronic state of the n-type silicon carbide layer, the n-type silicon carbide layer is formed and then retained under an atmosphere for ten hours or longer.

12. The method according to claim 10, wherein, in the stabilizing of the surface electronic state of the n-type silicon carbide layer, a surface of the n-type silicon carbide layer is treated by acid cleaning after forming the n-type silicon carbide layer.

13. The method according to claim 12, wherein one of hydrochloric acid hydrogen peroxide aqueous solution, sulfuric acid hydrogen peroxide aqueous solution, and ozone cleaning is adopted in the acid cleaning.

14. The method according to claim 10, further comprising:

growing epitaxially an n-type layer on a silicon carbide bulk substrate, wherein, in the stabilizing of the surface electronic state of the n-type silicon carbide layer, a surface electronic state of the n-type layer as the n-type silicon carbide layer is stabilized, and wherein, in the measuring of the n-type impurity concentration, an n-type impurity concentration of the n-type layer is measured.

15. The method according to claim 10, further comprising:

forming an epitaxial growth layer on a silicon carbide bulk substrate;

forming an impurity layer by performing ion implantation of impurities to the epitaxial growth layer; and growing epitaxially an n-type layer on the epitaxial growth layer and the impurity layer, wherein, in the stabilizing of the surface electronic state of the n-type silicon carbide layer, a surface electronic state of the n-type layer as the n-type silicon carbide layer is stabilized, and wherein, in the measuring of the n-type impurity concentration, an n-type impurity concentration of the n-type layer is measured.

* * * * *